(12) United States Patent
Falicoff et al.

(10) Patent No.: US 7,006,306 B2
(45) Date of Patent: Feb. 28, 2006

(54) CIRCUMFERENTIALLY EMITTING LUMINAIRES AND LENS-ELEMENTS FORMED BY TRANSVERSE-AXIS PROFILE-SWEEPS

(75) Inventors: Waqidi Falicoff, Newport Beach, CA (US); William A. Parkyn, Jr., Lomita, CA (US); Yupin Sun, Yorba Linda, CA (US); Juan Carlos Minano, Madrid (ES); Pablo Benitez, Madrid (ES)

(73) Assignee: Light Prescriptions Innovators, LLC, Irvine, CA (US)

( * ) Notice: Subject to any disclaimer, the term of this patent is extended or adjusted under 35 U.S.C. 154(b) by 0 days.

(21) Appl. No.: 10/903,925

(22) Filed: Jul. 29, 2004

(65) Prior Publication Data

US 2005/0024744 A1 Feb. 3, 2005

Related U.S. Application Data

(60) Provisional application No. 60/491,184, filed on Jul. 29, 2003.

(51) Int. Cl.
*G02B 27/02* (2006.01)
*G02B 17/00* (2006.01)

(52) U.S. Cl. ................. 359/800; 359/727; 359/642

(58) Field of Classification Search ............ 359/642, 359/798–800, 725; 385/146, 901, 145; 362/326–328, 362/335–340, 560
See application file for complete search history.

(56) References Cited

U.S. PATENT DOCUMENTS

| | | | |
|---|---|---|---|
| 1,399,973 A | * | 12/1921 | Limpert ............ 362/309 |
| 1,977,689 A | | 10/1934 | Muller |
| 2,254,961 A | | 9/1941 | Harris |
| 2,362,176 A | | 11/1944 | Swanson |
| 2,908,197 A | | 10/1959 | Wells et al. |
| 3,760,237 A | | 9/1973 | Jaffe |
| 3,774,021 A | | 11/1973 | Johnson |
| 3,938,177 A | | 2/1976 | Hansen et al. |
| 4,192,994 A | | 3/1980 | Kastner |
| 4,211,955 A | | 7/1980 | Ray |
| 4,337,759 A | | 7/1982 | Popovich et al. |
| 4,342,908 A | | 8/1982 | Henningsen et al. |

(Continued)

FOREIGN PATENT DOCUMENTS

EP 0 450 560 A2 10/1991

(Continued)

OTHER PUBLICATIONS

Remillard, Everson and Weber, "Loss Mechanisms Optical Light Pipes" *Applied Optics* vol. 31 #34 pp. 7232-7241 Dec. 1992.

(Continued)

*Primary Examiner*—Ricky Mack
(74) *Attorney, Agent, or Firm*—Thomas F. Lebens; Sinsheimer, Schiebelhut & Baggett

(57) ABSTRACT

The present embodiments provide methods and apparatuses for providing prescribed illumination. Some embodiments provide lenses that include a two-dimensional beam-forming lens-profile where the profile acts to deflect light rays from a light source into a relatively narrow output beam. A zone of higher refractive index than that of the area outside the profile is enclosed where the higher refractive-index zone admits the light rays, a transverse axis of revolution is further included and extends transversely across and outside of the lens-profile so that the transverse axis extends generally laterally with respect to a luminous centroid-direction of the output beam. The lens further includes a surface of revolution formed by circularly sweeping the lens-profile about the axis of revolution forming a circumferential beam from the output beam emitted by said surface of revolution.

38 Claims, 16 Drawing Sheets

U.S. PATENT DOCUMENTS

| | | |
|---|---|---|
| 4,388,673 A | 6/1983 | Maglica |
| 4,464,707 A | 8/1984 | Forrest |
| 4,638,343 A | 1/1987 | Althaus et al. |
| 4,675,725 A | 6/1987 | Parkyn |
| 4,698,730 A | 10/1987 | Sakai et al. |
| 4,727,289 A | 2/1988 | Uchida |
| 4,727,457 A | 2/1988 | Thillays |
| 4,920,404 A | 4/1990 | Shrimall et al. |
| 5,055,892 A | 10/1991 | Gardner et al. |
| 5,140,220 A | 8/1992 | Hasegawa |
| 5,302,778 A | 4/1994 | Maurinus |
| 5,335,157 A | 8/1994 | Lyons |
| 5,404,282 A | 4/1995 | Klinke et al. |
| 5,404,869 A | 4/1995 | Klinke et al. |
| 5,438,453 A | 8/1995 | Kuga |
| 5,452,190 A | 9/1995 | Priesemuth |
| 5,528,474 A | 6/1996 | Roney et al. |
| 5,557,471 A | 9/1996 | Fernandez |
| 5,577,492 A | 11/1996 | Parkyn et al. |
| 5,580,142 A | 12/1996 | Kurematsu et al. |
| 5,608,290 A | 3/1997 | Hutchisson et al. |
| 5,613,769 A | 3/1997 | Parkyn et al. |
| 5,655,830 A | 8/1997 | Ruskouski |
| 5,655,832 A | 8/1997 | Pelka et al. |
| 5,676,453 A | 10/1997 | Parkyn et al. |
| 5,757,557 A | 5/1998 | Medvedev |
| 5,777,433 A | 7/1998 | Lester et al. |
| 5,806,955 A | 9/1998 | Parkyn, Jr. et al. |
| 5,813,743 A | 9/1998 | Naka |
| 5,865,529 A | 2/1999 | Yan |
| 5,894,195 A | 4/1999 | McDermott |
| 5,894,196 A | 4/1999 | McDermott |
| 5,897,201 A | 4/1999 | Simon |
| 5,898,267 A | 4/1999 | McDermott |
| 5,898,809 A * | 4/1999 | Taboada et al. ............ 385/115 |
| 5,924,788 A | 7/1999 | Parkyn |
| 5,926,320 A | 7/1999 | Parkyn et al. |
| 5,966,250 A | 10/1999 | Shimizu |
| 6,019,493 A | 2/2000 | Kuo et al. |
| 6,030,099 A | 2/2000 | McDermott |
| 6,044,196 A | 3/2000 | Winston et al. |
| 6,048,083 A | 4/2000 | McDermott |
| 6,139,166 A | 10/2000 | Marshall et al. |
| 6,166,860 A | 12/2000 | Medvedev et al. |
| 6,166,866 A | 12/2000 | Kimura et al. |
| 6,177,761 B1 | 1/2001 | Pelka et al. |
| 6,181,476 B1 | 1/2001 | Medvedev |
| 6,201,229 B1 | 3/2001 | Tawa et al. |
| 6,268,963 B1 | 7/2001 | Akiyama |
| 6,273,596 B1 | 8/2001 | Parkyn |
| 6,282,821 B1 | 9/2001 | Freier |
| 6,301,064 B1 | 10/2001 | Araki et al. |
| 6,350,041 B1 | 2/2002 | Tarsa et al. |
| 6,361,190 B1 | 3/2002 | McDermott |
| 6,450,661 B1 | 9/2002 | Okumura |
| 6,473,554 B1 | 10/2002 | Pelka |
| 6,483,976 B1 | 11/2002 | Shie et al. |
| 6,488,392 B1 | 12/2002 | Lu |
| 6,502,964 B1 * | 1/2003 | Simon ........................ 362/328 |
| 6,504,301 B1 | 1/2003 | Lowery |
| 6,536,923 B1 | 3/2003 | Merz |
| 6,547,400 B1 | 4/2003 | Yokoyama |
| 6,547,423 B1 | 4/2003 | Marshall et al. |
| 6,560,038 B1 | 5/2003 | Parkyn et al. |
| 6,578,989 B1 | 6/2003 | Osumi et al. |
| 6,580,228 B1 | 6/2003 | Chen et al. |
| 6,582,103 B1 | 6/2003 | Popovich et al. |
| 6,598,998 B1 | 7/2003 | West et al. |
| 6,603,243 B1 | 8/2003 | Parkyn et al. |
| 6,607,286 B1 * | 8/2003 | West et al. ................. 362/255 |
| 6,616,287 B1 | 9/2003 | Sekita et al. |
| 6,621,222 B1 | 9/2003 | Hong |
| 6,637,924 B1 | 10/2003 | Pelka et al. |
| 6,639,733 B1 | 10/2003 | Minano et al. |
| 6,646,813 B1 | 11/2003 | Falicoff |
| 6,647,199 B1 | 11/2003 | Pelka et al. |
| 6,674,096 B1 | 1/2004 | Sommers |
| 6,679,621 B1 * | 1/2004 | West et al. ................. 362/327 |
| 6,688,758 B1 | 2/2004 | Thibault |
| 6,786,625 B1 | 9/2004 | Wesson |
| 6,796,698 B1 | 9/2004 | Sommers et al. |
| 6,803,607 B1 | 10/2004 | Chan et al. |
| 6,811,277 B1 * | 11/2004 | Amano ........................ 362/31 |
| 2002/0034012 A1 | 3/2002 | Santoro et al. |
| 2002/0080623 A1 | 6/2002 | Pashley |
| 2003/0076034 A1 | 4/2003 | Marshall |
| 2004/0070855 A1 | 4/2004 | Benitez |
| 2004/0105171 A1 | 6/2004 | Minano |
| 2004/0189933 A1 | 9/2004 | Sun |
| 2005/0117125 A1 | 6/2005 | Minano et al. |
| 2005/0129358 A1 | 6/2005 | Minano et al. |

FOREIGN PATENT DOCUMENTS

| | | |
|---|---|---|
| ES | 2142752 | 12/2000 |
| SU | 1282051 A1 | 1/1987 |
| WO | WO 99/09349 | 2/1999 |
| WO | WO 99/13266 | 3/1999 |
| WO | WO 01/07828 A1 | 2/2001 |
| WO | WO 03/066374 A2 | 8/2003 |
| WO | WO 03/066374 A3 | 8/2003 |
| WO | WO 04/007241 A2 | 1/2004 |

OTHER PUBLICATIONS

Parkyn et al The Black Hole™: Cuspated waveguide-injectors and illuminators for LEDs; Part of the SPIE Conference on Nonimaging Optics: Maximum Efficiency Light Transfer V, Denver, CO, Jul. 1999.

Hyper ARGUS®LED, Hyper-Bright, 3mm (T1) LED, Non Diffused; Mar. 1, 2000; Infineon Technologies, pp. 1-9.

Spigulis, "Compact dielectric reflective elements, Half-sphere concentrators of radially emitted light" *Applied Optics* vol. 33, No. 25, Sep. 1994.

International Search Report, PCT/US03/32076.

Benitez, P. "Chapter 6: The SMS design method in three dimensions", from *Conceptos avanzados de óptica anidólica: diseño y fabricación*, PhD dissertation, UPM, (1998).

Benitez, P.; Mohedano, R.; Minano, J. "Design in 3D geometry with the Simultaneous Multiple Surface design method of Nonimaging Optics" Instituto de Engergla Solar, E.T.S.I. Telecommunicacion, Universidad Politecnica, 28040. Madrid, Spain (Jul. 1999).

International Search Report. PCT/US03/38240, Jul. 26, 2004.

International Search Report. PCT/US03/38024, Nov. 10, 2004.

International Search Report. PCT/US04/14938, Mar. 1, 2005.

* cited by examiner

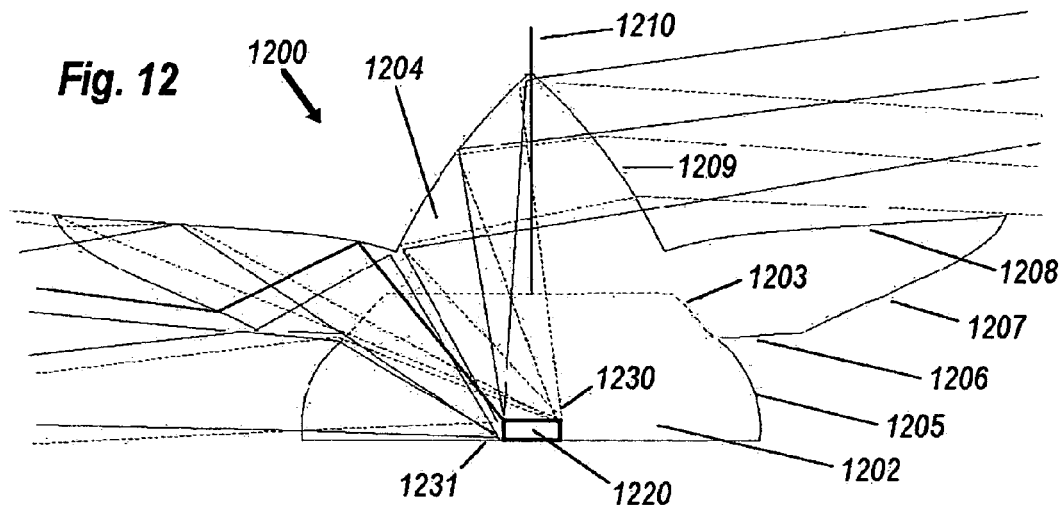
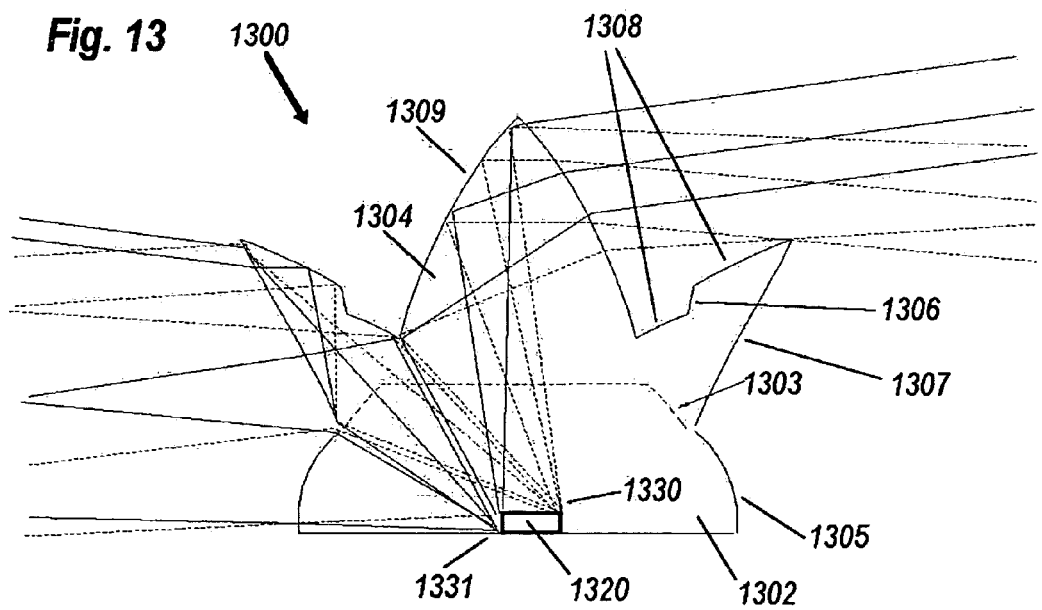

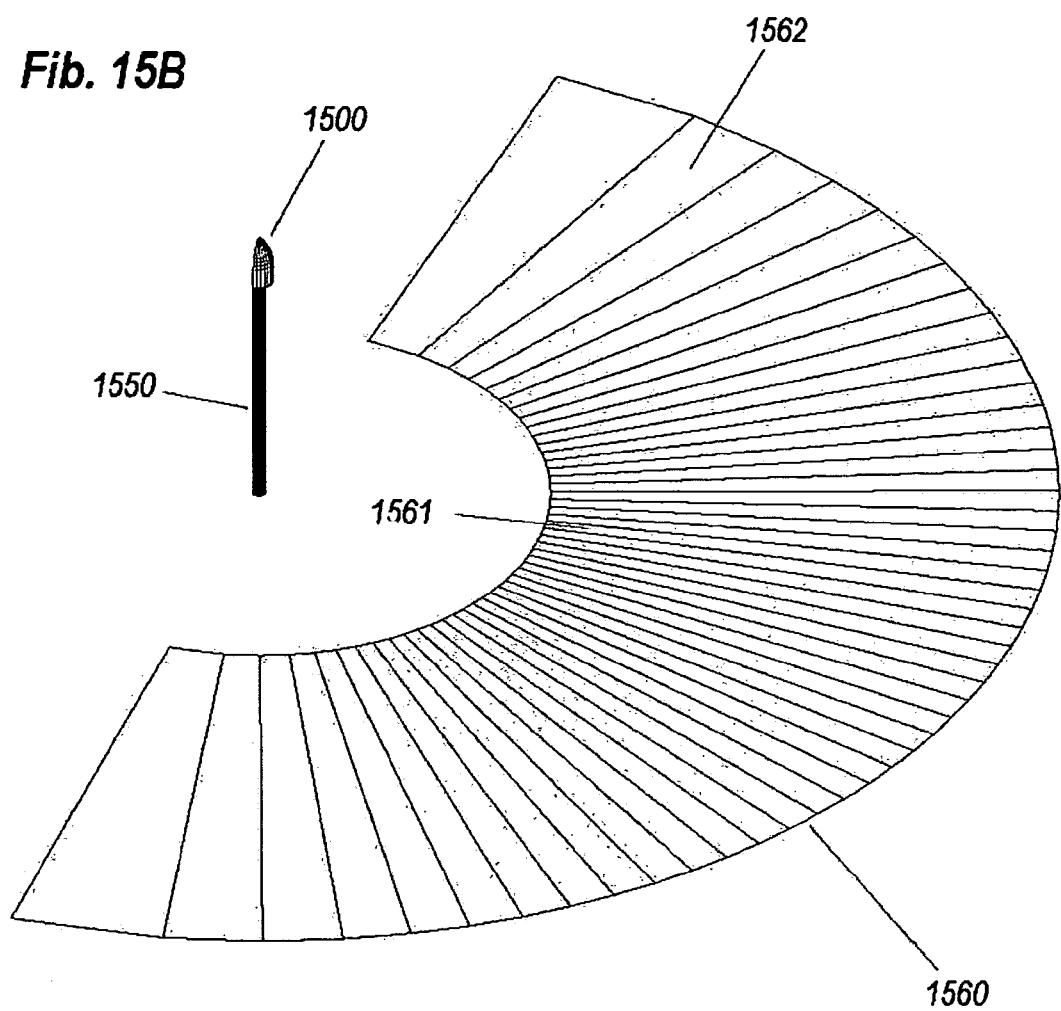
Fib. 15B

CIRCUMFERENTIALLY EMITTING LUMINAIRES AND LENS-ELEMENTS FORMED BY TRANSVERSE-AXIS PROFILE-SWEEPS

PRIORITY CLAIM

This application claims the benefit of U.S. Provisional Application No. 60/491,184, filed Jul. 29, 2003, which is incorporated herein by reference in its entirety.

BACKGROUND

The present invention relates generally to illumination, and more particularly to producing circular or semicircular emission with in an equatorial-type solid angle.

Numerous illumination situations require lighting devices that emit a planar 360° pattern, like a time-exposure picture of a lighthouse-beam sweeping around the horizon. U.S. Pat. No. 6,473,554, by Pelka and Popovich, incorporated herein by reference, utilizes a conicoid figure of revolution situated just over an LED light source, with the axis of revolution in a vertical direction. This cuspated reflector laterally deflects the rays going upward from the source, by internal reflection within a dielectric material. Similar configurations in metallic reflectors have been known for far longer. The principal characteristic of this approach is its aspect ratio, with device diameter two or more times device thickness. This is advantageous in applications where devices height must be minimized. In other situations, however, horizontal size must be minimized, such as with LEDs on a circuit board. Also, for light-injection such devices must be surrounded by the waveguide, since a less-than-360° emission-pattern wastes light.

A 180° emission pattern, however, is desirable, for injection into the edge of a waveguide. Doing this in accordance with the prior devices and/or methods would throw away half the light.

SUMMARY OF THE EMBODIMENTS

The present embodiments advantageously address the needs above as well as other needs by providing an apparatus for use in providing illumination.

In some embodiments, an illumination lens is provided. The lens comprises a two-dimensional beam-forming lens-profile where the profile acts to deflect light rays from a light source into a relatively narrow output beam. The lens-profile encloses a zone of higher refractive index than that of the area outside the profile where the higher refractive-index zone admits the light rays. A transverse axis of revolution is further included and extends transversely across and outside of the lens-profile so that the transverse axis extends generally laterally with respect to a luminous centroid-direction of the output beam. The lens further includes a surface of revolution formed by circularly sweeping the lens-profile about the axis of revolution forming a circumferential beam from the output beam emitted by said surface of revolution.

Some alternative embodiments provide methods for generating or designing a lens. These methods define a two dimensional profile having an output surface and an input surface; define an axis of symmetry; and circularly sweep the profile about the axis of symmetry defining the output surface in three-dimensions, wherein the output surface is radially distanced generally laterally with respect to the axis of symmetry.

In some preferred embodiments, methods for generating a light output are provided. Theses methods refract initial light, internally reflecting the light, and again refracting the light producing an output light that is circumferentially emitted.

An apparatus is provided in some embodiments for use in directing an output beam. This apparatus includes a two-dimensional profile, an axis of symmetry, a three-dimensional volume defined by rotating the two-dimensional profile about the axis of symmetry, and an output surface defined on the three-dimensional volume such that a luminous centroid-direction of an output beam is directed lateral to the axis of symmetry from the three-dimensional volume through the output surface.

Some embodiments additionally and/or alternatively provide an apparatus that includes a two-dimensional beam-forming lens-profile with a relatively small focal zone from which geometric-optical design-rays diverge with a relatively wide angular swath. The profile acts to deflect said design-rays from said focal zone into a relatively narrow output beam, the lens-profile enclosing a zone of higher refractive index than that of the area outside it, and the higher refractive-index zone has a profile admitting said design-rays. The apparatus further includes a transverse axis of revolution passing through said focal zone and running transversely across and outside of said lens-profile so that it runs generally laterally with respect to a luminous centroid-direction of said output beam, and a surface of revolution formed by circularly sweeping said lens-profile about an axis of revolution. The sweeping acts on said focal zone to outline a focal volume, and the sweeping action on said output beam forms a circumferential beam emitted by said surface of revolution. The apparatus can further include a light source positioned in the focal volume. Additionally, the lens-profile can further include totally internally reflecting facets.

A better understanding of the features and advantages of the present embodiments will be obtained by reference to the following detailed description of the embodiments and accompanying drawings, which set forth illustrative embodiments in which the principles of the embodiments are utilized.

BRIEF DESCRIPTION OF THE DRAWINGS

The above and other aspects, features and advantages of the present embodiments will be apparent from the following more particular description thereof, presented in conjunction with the following drawings wherein:

FIG. 12 shows an added variation of the 360° swept TIR lens of FIG. 10 shaped with horizontal extrusions for a reflective coating;

FIG. 13 shows a supplementary variation of the 360° swept TIR lens of FIG. 11 shaped with tilted extrusions for a reflective coating;

FIG. 15B shows an ocular illumination pattern of the 180° sweep for the variation of the swept TIR lens of FIG. 15A on a plane at a base of a mounting post;

Corresponding reference characters indicate corresponding components throughout the several views of the drawings.

DETAILED DESCRIPTION OF THE PREFERRED EMBODIMENTS

Figure 1A:
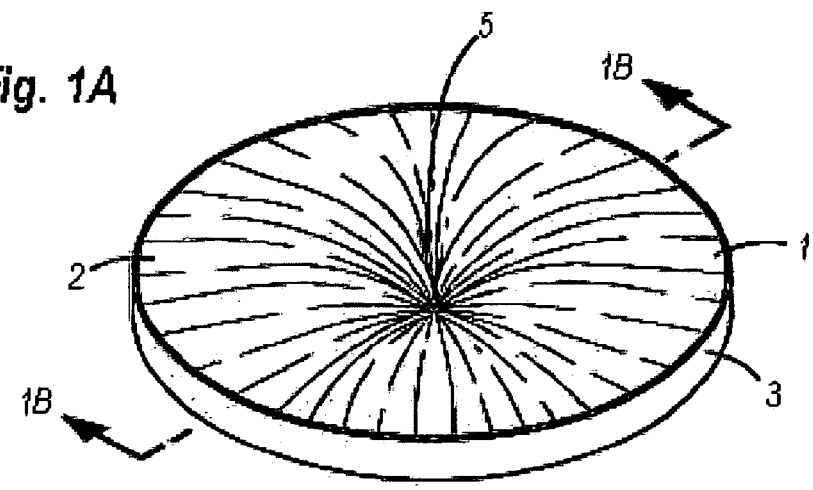
FIG. 1A is a perspective view of cuspated conicoid reflectors for 360° waveguide injection of immersed light sources via total internal reflection.

The present embodiments relate generally to illumination, and particularly to producing circular or semicircular emission with in an equatorial-type solid angle.

A circular emission pattern is useful for circumferential illumination, while semicircular emission is particularly advantageous for waveguide injection, such as for exit signs, instrument displays and other similar implementations. Some preferred embodiments utilize profiles of faceted total-internal-reflection lenses. Totally internally reflecting (TIR) lenses, such as those disclosed in U.S. Pat. No. 5,404,869 by Parkyn, Pelka, and Popovich, and U.S. Pat. Nos. 5,676,453 and 5,806,955 by Parkyn and Pelka, which are incorporated in there entirety herein by reference, utilize faceted profiles as circularly swept around an axis parallel to the output beam, or linearly swept along a line perpendicular to the faceted profile.

Some present embodiments instead utilize the transverse axis of a lens profile as the symmetry axis of a circular sweep. This advantageously allows a narrower angular thickness of equatorial emission, as well as the ability to tailor a conical emission pattern for illumination of a nearby surface. A manufacturing method is disclosed to deal with the negative draft angles on the interior facets.

One of the significances of a transverse-axis profile sweep is that the sweep includes the output beam of the swept profile, whereas in the above-mentioned lenses that are circularly swept around an axis parallel to the output beam or linearly swept along a line perpendicular to the faceted profile, the output beam is not so swept, and thus has the same directionality as that of the profile being swept. The lens profile has a focal zone from which originate design-rays lying in the plane of the lens profile, and diverging from that focal zone. These mathematical design rays will be deflected into a relatively narrow beam, such as ±25° or less. This planar output is then circularly swept to form a circumferential beam.

The planar output of a lens profile consists of design rays originating from the profile's focal zone, having weighted luminance values that express the characteristics of the light source to be used. These weighted luminance values can be used to calculate the radiant centroid, the average beam direction. Depending upon the particular lens profile, this radiant centroid can be perpendicular to or oblique to the sweep axis. The former can be termed equatorial emission, the latter latitude emission. Both are types of circumferential emission, which the current embodiments produce.

Some embodiments the also provide several means of creating highly collimated beams from extended sources (such as LEDs) by redirecting the equatorial output from the aforementioned apparatus, back along the axis of circular symmetry. This is accomplished, in one embodiment, by using a single conical reflector. Alternatively or additionally, a highly collimated beam is achieved through the incorporation of 90-degree turning TIR facets onto the exterior of the solid dielectric transverse swept TIR lens. The resulting design is a single solid dielectric part that typically requires no metallization.

This approach is very useful for sources with a nearly Lambertian hemispherical intensity pattern, such is the case with most LEDs. In this case the rays emanating from the source with the maximum intensity (those which are approximately normal to the front emitting surface of the source), strike those facets on the inner TIR lens, which are furthest from the source. This is not the case for previous TIR lens, which typically have central lens areas very close to the source, while its exterior edges are furthest from the source.

The present embodiments provide designs with several performance benefits over other lenses. One of these benefits is that the beam can be more highly collimated then a traditional TIR lens, and therefore can approach the theoretical divergence angle limits set by laws of nonimaging optics. Another benefit of using such devices is that it is possible to create a very uniform beam with outputs that have a very sharp cutoff. This is useful for many applications that need tight collimation, such as automotive forward lighting and other lighting that employ sharp cutoffs.

Some embodiments additionally and/or alternatively utilize the transverse axis of a lens profile as the symmetry axis of a circular sweep in generating lens that are capable of producing off-axis beams. For example, some embodiments employ the teachings of U.S. patent application Ser. No. 10/622,874, filed Jul. 18, 2003, entitled ASYMMETRIC TIR LENSES CREATING OFF-AXIS BEAMS, which is incorporated herein by reference in its entirety, to provide lenses having a circularly swept profile that generate off-axis beams.

In some embodiments, the solid dielectric part has four optical redirecting surfaces, 2 refractive surfaces and 2 TIR surfaces, one more than a traditional TIR surface, this confers an increased degree of controllability on the output beam pattern. For example, the external TIR facets can be curved using tailored shapes designed via simultaneous multiple surface (SMS) methods referenced earlier, or by other traditional design methods known to those versed in the field of nonimaging optics.

By combining the above-mentioned equatorial collimators with an adjustable angle-redirecting reflector, some embodiments are capable of producing beams with an adjustable beam divergence. Such variable output devices are useful for such applications as flashlights, theater lighting and other similar uses.

Referring to FIG. 1A, a depiction is shown of a waveguide 1 with a top surface 2, a side surface 3, and an indented central region 5, which is similar to the waveguide shown in FIG. 15 of U.S. Pat. No. 6,473,554. Also shown is cross section 1B, as depicted in FIG. 1B.

Figure 1B:
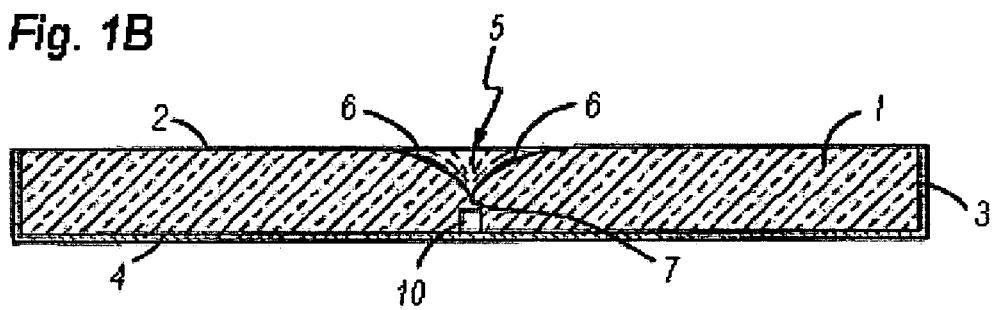
FIG. 1B is a cross-section of the cuspated conicoid reflectors of FIG. 1A taken along line 1B—1B as indicated in FIG. 1A.

Referring to FIG. 1B, shown is a cross-section of the waveguide 1 of FIG. 1A, showing the top surface 2, the side surface 3, and a bottom surface 4, which is similar to the waveguide shown in FIG. 16A of U.S. Pat. No. 6,473,554. The indented central region (central indentation 5) is formed by an indentation curve 6 that ends at a central cusp 7. Just beneath the central cusp 7 is a light source 10, generally an LED.

Figure 1C:
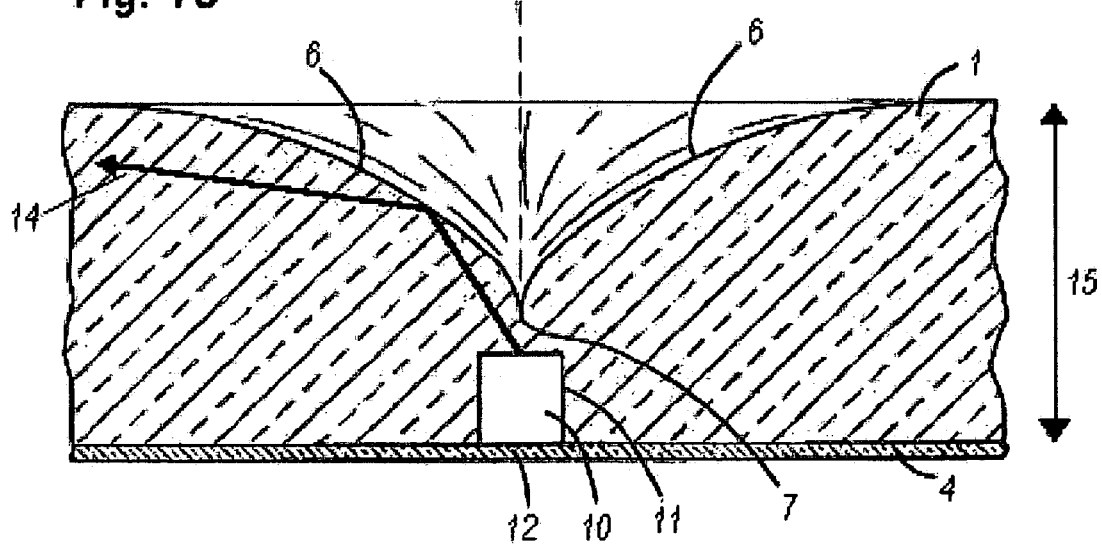
FIG. 1C is a close-up view of a center of the cuspated conicoid reflectors of FIG. 1B.

Referring to FIG. 1C, shown is a close-up of the waveguide 1 of FIGS. 1A–1B, showing the bottom surface 4, and the indentation curve 6 ending in the central cusp 7, which is situated just above the light source 10, which is similar to the waveguide shown in FIG. 16B of U.S. Pat. No. 6,473,554. Also shown is a cavity 11 enclosing the light source 10. A diffuse reflector 12 is installed on the bottom surface 4 and the side surface 3, as shown in FIG. 1B. A symmetry axis 8 passes through the central cusp 7 and acts as the axis of revolution of the waveguide 1. The more pointed the central cusp 7 is the less light that leaks through along a line of sight 13, suppressing a visual hot spot. An exemplary ray 14 is shown emitted from the light source 10 and internally reflected at the indentation curve 6. An overall device thickness 15 is minimized when the indentation curve 6 is an equiangular spiral for a point source.

The lens 1 is deficient in that it must be installed within a waveguide, not along its edges. This is because it cannot be used in a 180° sweep angle without losing half the luminous output of light source 10.

Figure 2:
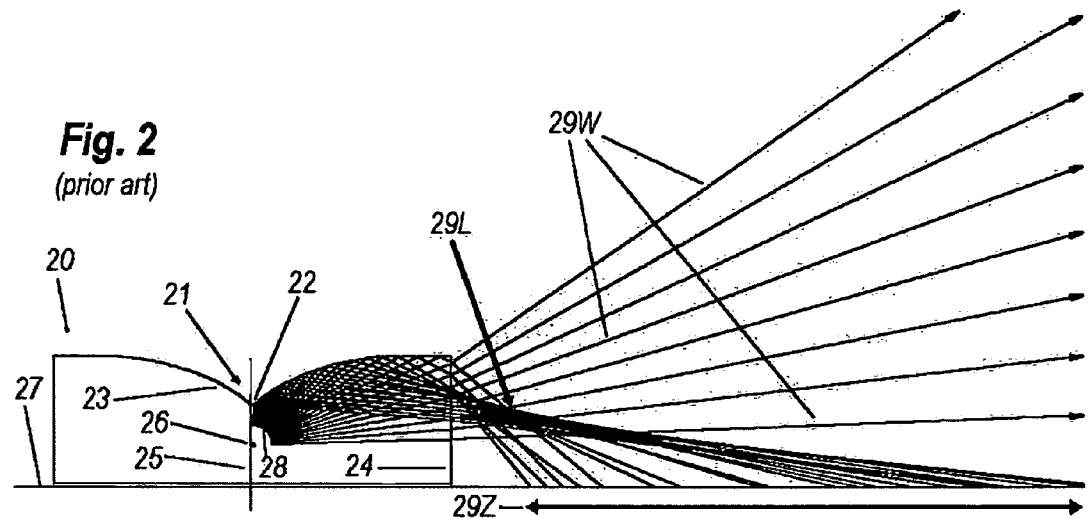
FIG. 2 is cross-section view of a variation of the cuspated conicoid reflectors of FIG. 1C used in a stand-alone fashion for proximity illumination, wherein performance-representative rays are shown.

Referring to FIG. 2, a depiction is shown of a device not illustrated in U.S. Pat. No. 6,473,554. FIG. 2 depicts a standalone discoidal lens 20 used for proximate illumination by emission out of an outer edge 24, made from a transparent dielectric. Discoidal lens 20 has a central indentation 21 with a cusp 22. The central indentation 21 is formed by a 360° sweep of a curve 23 around a vertical axis 25, which runs through a cusp 22 and a focal point 26. Instead of the waveguide-injection function of the waveguide 1 of FIG. 1A, the discoidal lens 20 is used to illuminate a horizontal surface 27, such as a diffuse reflector. A ray fan 28 proceeds outward from the focal point 26, representing a luminous output of, e.g., an LED chip, radiating from 0 to 90° from the vertical axis 25. The rays striking a top surface of the discoidal lens 20 will be internally reflected downward to an outer edge 24, proceeding radially outward therefrom as illumination rays 29L, with external angles in accordance with Snell's law. Upward going external rays 29W were those that missed the upper surface and hit the outer edge 24 directly, so that they are wasted for illumination of the horizontal surface (or other target plane 27). Illumination rays 29L act to illuminate annular zone 29Z of circumferential illumination, surrounding lens 20.

Discoidal lens 20 is optically deficient in at least two ways:
 (i) The loss of upward-going rays 20W; and
 (ii) The small size and uneven illumination of a zone 29Z.

The present embodiments improve upon this approach by alleviating at least the above-mentioned deficiencies. The present embodiments include novel luminaires for light-emitting diodes, for any number of implementations and particularly for the above-mentioned applications of waveguide injection and near-field illumination.

Figure 3A:
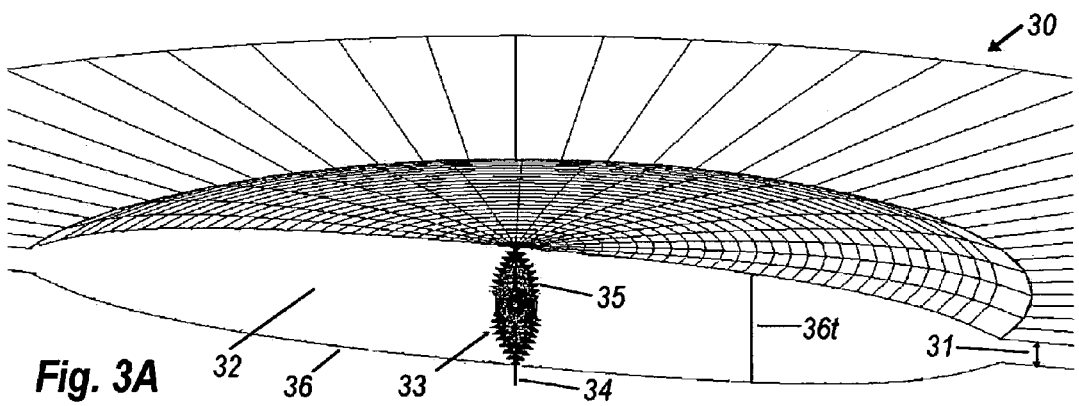
FIG. 3A is a 180° swept TIR lens forming a cavity in an edge of an illumination waveguide.

Referring to FIG. 3A, shown is one embodiment of a lens 30 formed as an indentation into an edge of an illumination waveguide. Semi-disc 30 is formed of a transparent dielectric such as acrylic, advantageously available for injection molding, or other similar material. This semicircular shape is for illustration and represents any illumination waveguide needing edge-injected light.

FIG. 3A depicts lens 30, according to some embodiments, comprising a waveguide with thickness 31, typically constant. Lens 30 is a 180° sweep about axis 34. Compound Parabolic Concentrator (CPC) section 32 expands inward in thickness to accommodate faceted indentation 33 that is shown about 5 times wider than 31. Indentation 33 is formed by a 180° sweep of TIR profile 35. CPC profile 36 is shown as the full ideal extent, but in some embodiments, it is truncated at line 36t, which moves inward to coincide with axis 34. In some embodiments, CPC profile is implemented through dual-semiconic section defined by the profile parabolic curve (which deviates slightly in some implementations from a straight line) or some other similar configuration. The top and bottom portions of lens 30 are generally in bilateral symmetry.

Figure 3B:
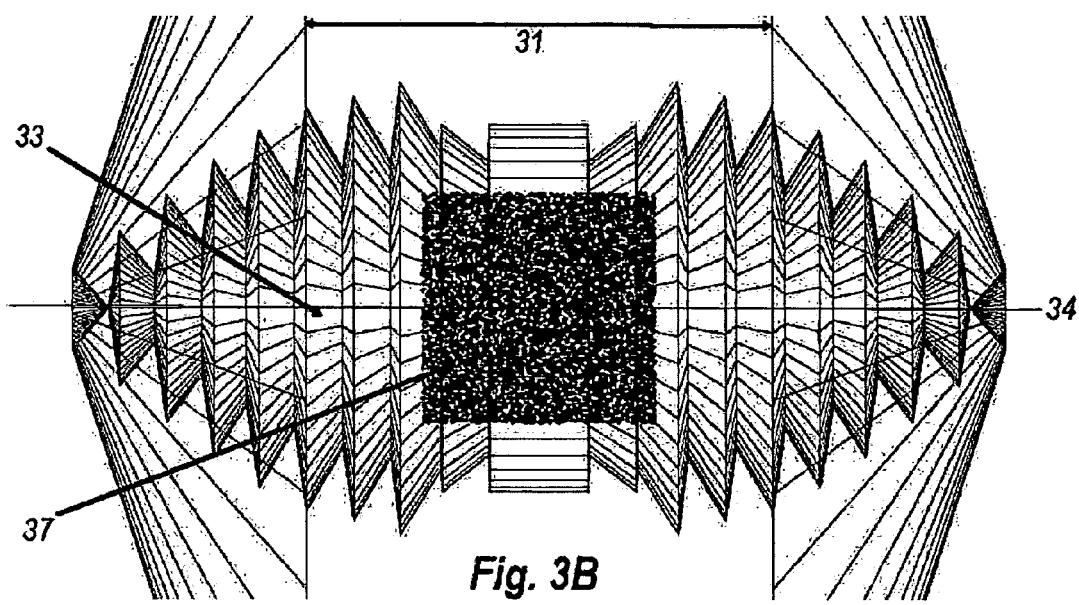
FIG. 3B is a close-up view of the 180° swept TIR lens of FIG. 3A showing the position of an LED chip and size of the LED chip relative to a thickness of the illumination waveguide.

Referring to FIG. 3B, edge-on view is shown of the faceted indentation 33 of FIG. 3A, also showing waveguide thickness 31 and rotational axis 34. Also shown is LED chip 37, and its width is about ⅔ that of waveguide thickness 31. For refractive index n (e.g., here about 1.5) the waveguide thickness at the indentation interface is at least n times greater than the chip width, for substantially all of the chip's luminous output to be injected into the waveguide. Faceted indentation 33 can be big enough to accommodate nearly any packaging for chip 37, so that is why it is bigger than thickness 31.

The profile of the semiconic section 32 is determined by applying the methods of nonimaging optics. The semiconic section, at least in part, transforms the highly collimated light (typically not in the radial direction) emitted through the inner circumferential TIR lens portion 35 and to expand the beam angle in that direction so that it is directed and/or coupled into the waveguide. In some preferred embodiments, each edge ray from the TIR lens portion is redirected such that it strikes the outer surfaces of the waveguide at an incidence angle above a critical angle. The incidence angle is defined as the angle made between the normal to a surface of the guide and the ray. The critical angle is proportional to the index of refraction of the material of the guide, and for example typically is between 40 and 45 degrees for common dielectric plastics. Rays that strike the surface at an incidence angle above the critical angle generally exhibit total internal refection and as such propagate down the waveguide. In some embodiments, therefore, the lens 30 is configured such that substantially every ray from substantially every facet of the inner TIR lens portion 35 strikes the outer surfaces of the waveguide section at an incidence angle above the critical angle. Some implementations further configure the lens such that the incident angle is greater than the critical angle by at least one and preferably more than one degree to establish a safety margin, which at least in part accommodates the tolerances associated with manufacturing such as injection molding.

The profile of the semi-disc lens 30 is determined, in some implementations, using the edge principle of nonimaging optics for ray bundles, and preferably substantially each ray bundle from the TIR lens portion 35. For each ray bundle from each facet there is an angle transformer shape that redirects the light into the waveguide and in addition increases the beam spread so as to conserve etendue and allow the light to be coupled into the waveguide above the critical angle. Some embodiments employ transformer shapes to accomplish the redirection of the light through shapes that are well known in the field of nonimaging optics and are known as angle transformers. Reference information on angle transformer shapes that can be employed in some embodiments are provide in, "The Handbook of Optics", Second Edition, Volume III, pages 2.19 and 2.20, published by McGraw Hill in 2001, incorporated herein by reference. This reference cites a number of profile angle transformer shapes suitable for use in at least some implementations of the design of the dual-semiconic section 32.

Suitable curves that define the profile of the parabolic curve 36 are numerous, and in some embodiments, include a combination of a Compound Parabolic Concentrator (CPC) and a cone, two CPCs, and a single cone, and smooth and segmented tailored shapes, and other such curves. In the case of the cone solution, for example, the diameter of the semiconic section 32 may be slightly larger than the other solutions. The minimum diameter required for the section depends on the shape and size of the circumferential TIR profile, the size of the source, the thickness of the waveguide, the type of angle transformer used and/or other considerations. For a given set of conditions the required optical solutions are well established in the field of nonimaging optics and are readily known to those skilled in this art.

Figure 3C:
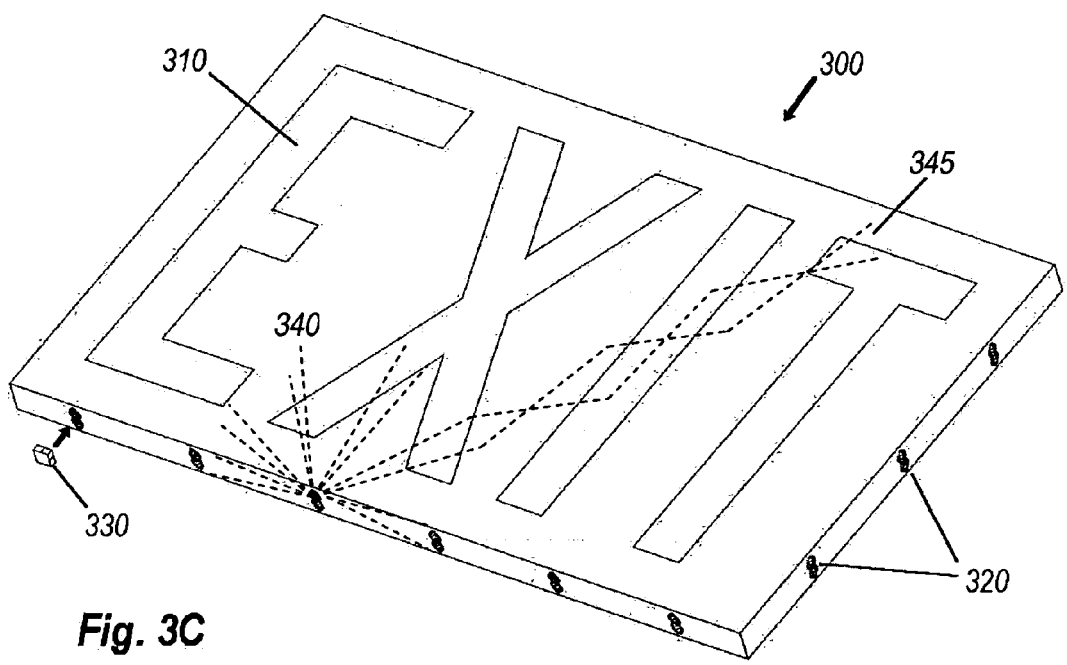
FIG. 3C shows an exit sign employing 180° TIR lenses such as the 180° swept TIR lens of FIG. 3A.
Figure 3D:
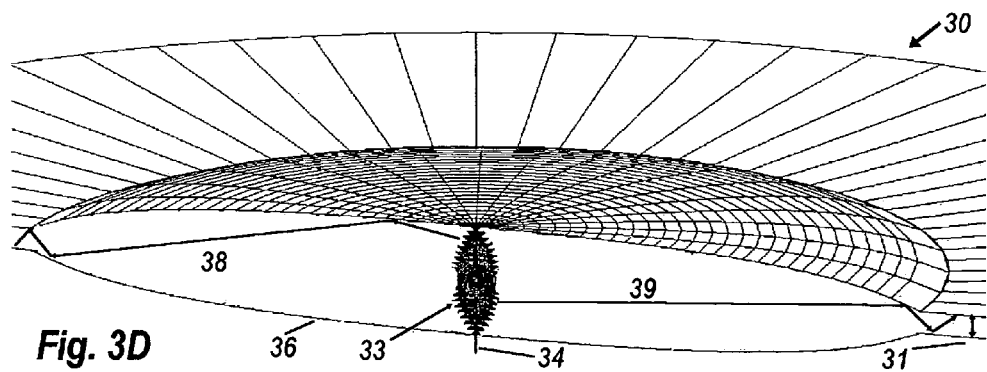
FIG. 3D shows the lens of FIG. 3A with the addition of light rays proceeding from TIR lens profile.

FIG. 3D shows the lens 30 of FIG. 3A with the addition of light rays 38 and 39 proceeding from TIR lens profile 35. In some embodiments, CPC profile 36 couples the narrow angular output of the TIR lens with the ±48° (1-critical angle) of light that is guided within 31. Light ray 38 is emitted from the TIR profile 35 and directed away from the axis 34, and in some embodiments approximately perpendicular to axis 34, travels through the dielectric medium of the section 36 where it strikes the top surface of section 36 and is redirected by TIR to the bottom entrance of the waveguide. Thereupon it is redirected by repeated TIR through the waveguide. Note that ray 38 strikes the bottom and top surfaces of the waveguide at an angle of incidence above the critical angle.

Figure 3E:
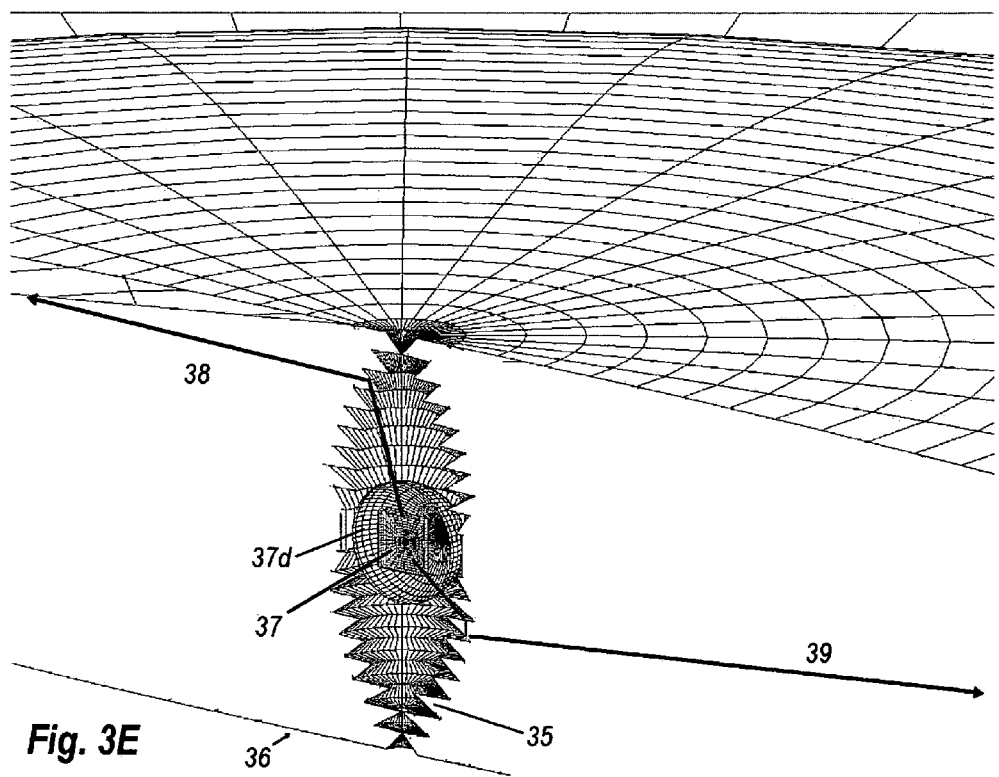
FIG. 3E shows a close-up view of the lens of FIGS. 3A–3D

FIG. 3E is a close-up of FIG. 3D, additionally showing emitting chip 37 inside epoxy dome 37d and positioned at the TIR profile 35. Rays 38 and 39 originate from chip 37 pass through dome 37d and enter TIR profile 35. For example, a ray, in some instances, is refracted at a first surface of a TIR tooth and is then redirected by the second surface of the tooth radially outward.

Referring to FIG. 3C, shows waveguide exit sign 300, with standard letters 310 from which light is scattered. LED 330 is shown as being installed in one of several TIR cavities 320, similar to 33 of FIG. 3A. Cavities 320 are molded into waveguide sign 300.

Radial beams outputted from one of the molded cavities 320 are illustrated by dotted ray bundles 340. An example of the vertical collimation of the beam output from the TIR cavities 320 and the propagation path into the waveguide is illustrated by the dotted ray pair 345. In some embodiments, as can be seen from the ray paths of 340 and 345, the beam from each cavity 320 fully flashes the dielectric of the waveguide with a beam which flashes 180 degrees in the horizontal direction and is partially collimated in the vertical direction.

The degree of collimation is determined by the size of the source, and the thickness of the dielectric and the laws of nonimaging optics. The smaller the source is in relation to the thickness of the waveguide the tighter the collimation that is possible. The spread in the horizontal direction is unaffected by these constraints. However, the inner molded lens is designed so as to clear dimensions of the source.

In addition, the size and pitch of the TIR facets are, in some implementations, limited by molding considerations. In some embodiments, the pitch of the TIR lenses is not less than about 0.75 mm. For example, some preferred embodiments, utilize a pitch of about 1 mm for the TIR teeth. With this pitch the tip and notch radii can be held to approximately 10 microns in the manufacture of the mold and during the molding process. At this radius the losses due to miss-directed rays are negligible, typically a few percent at most. The 1 mm pitch guideline is applied in some embodiments for TIR facets which are flat or for those that are curved. This pitch value can be used to determine the number of teeth to be incorporated for a design. For example, given a waveguide with a depth of 20 mm and a source which is one mm square, the number of TIR facets on the top and bottom sections of the molded lens would be approximately 18 (9 on the top and 9 on the bottom) with a central lens having a height of under 2 mm. Further in this example, the teeth have a pitch of less than 1 mm to accommodate tolerances associated with the molding process.

The present embodiments are designed in some implementations to be similar to design of traditional TIR lenses, and have a central lens, a section with Fresnel facets employing redirection by refraction only, and finally a section which employs TIR facets that redirect by a combination of refraction and TIR. The TIR facets can have faces that are either flat or can be curved as is desired. Some embodiments use curve facets to achieve a slightly higher collimation in the vertical direction than with the straight facets.

Some present embodiments utilize circumferential, sweep and other principles in designing desired lenses, waveguides and/or other optical systems. Further, some embodiments additionally employ other design and manufacturing techniques as are known in the art of flat and curved faceted TIR lens.

Some present embodiments incorporate design considerations, such as those known by one skilled in the art of TIR lens designs, for circumferential TIR lenses such that the beam output can be varied to achieve a variety of performance goals. For example, with a given height of the lens and size of source the vertical beam spread can be adjusted up or down as limited by the laws of nonimaging optics. The vertical spread can be adjusted for specific prescriptive goals by subtle adjustments of the shape and position of the central lens, Fresnel facets and TIR lenses.

In some preferred embodiments, the molded cavities 320 are part of the waveguide as they are molded into the edge of the waveguide. This reduces the number of optics needed as compared with traditional solutions, which typically use individual optics for each light source. The incorporation of the molded cavity into the waveguide lowers the cost of the units, at least in volume production. In addition, by having an integrally molded part the overall coupling efficiency is higher than the previous solutions, which typically employ independent optics. Further, the 180 degree radial output from the integrally molded lens of some present embodiments fully flashes the volume of the waveguide and aids in improving the uniformity of the output.

Figure 4A:
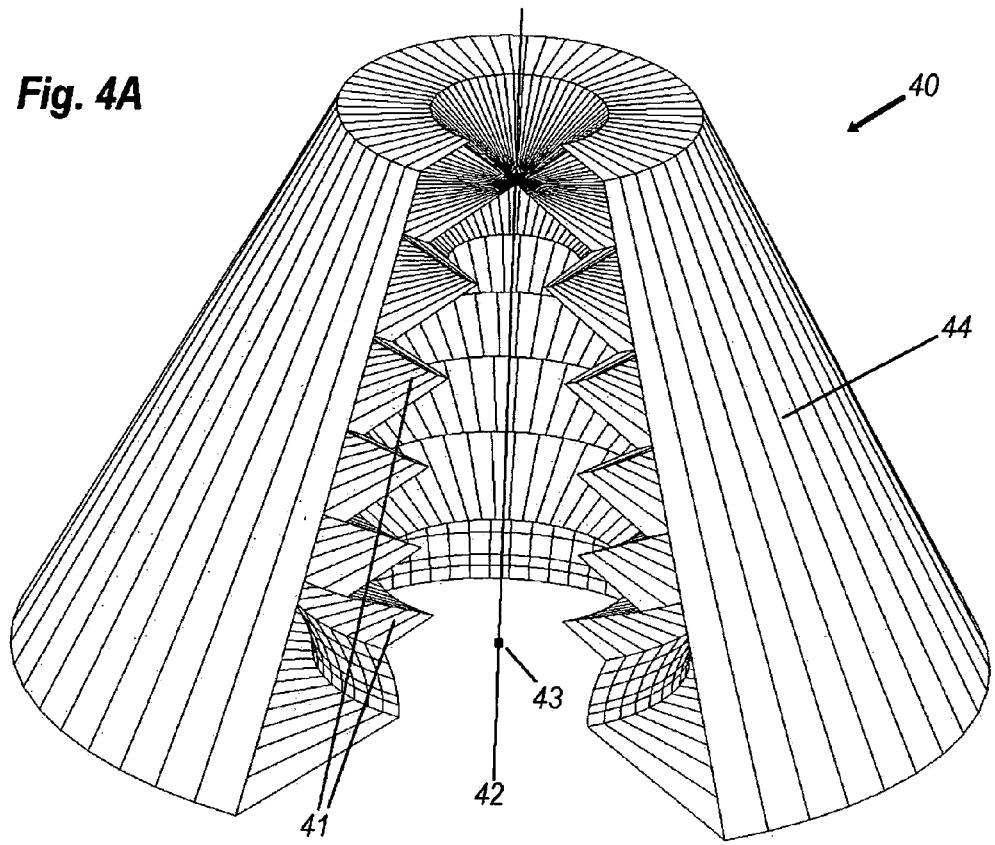
FIG. 4A is a perspective view of a 360° swept TIR lens.

Some preferred embodiment provide for proximate illumination. FIG. 4A is a cutaway view of a lens 40 that provides proximate illumination. Internal faceting 41 is formed by a 360° sweep about vertical axis 42, which passes through focal point 43. Conical exit face 44 is shown straight, but can be curved for tailoring the directionality of the output.

Figure 4B:
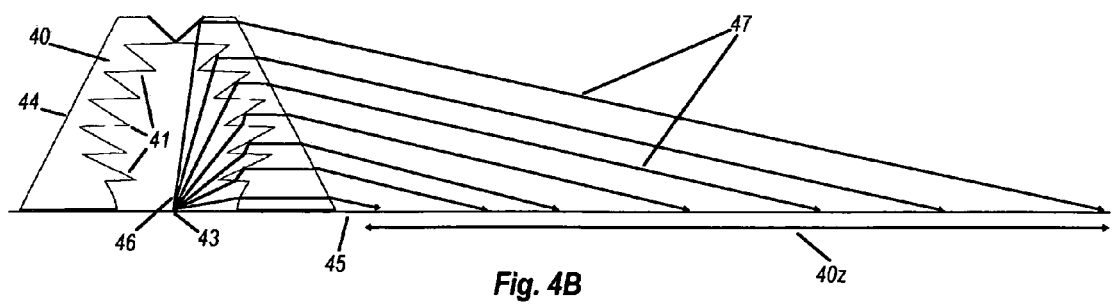
FIG. 4B is a cross section of the 360° swept TIR lens of FIG. 4A, wherein rays show how the 360° swept TIR lens produces an illumination pattern around the 360° swept TIR lens.

Referring to FIG. 4B, shown is a cross-section of lens 40, with facets 41, focal point 43, and conical exit face 44. Also shown is diffuse reflector 45. Ray fan 46 radiates out of focal point 43 and is redirected by lens 40 into downward-going circumferential rays 47, thereby illuminating annular zone 40Z. The exact shape of exit face 44 can be tailored to make this illumination uniform, in accordance with the directional characteristics of the light source placed at focal point 43.

In some embodiments, the shape of the exit face 44 is approximated by assuming that the output from the inner circumferential lens is generally parallel, and using the method in nonimaging optics known as the Integrated Flux Method with the prescription requirements to determine the shape of exit face 44. In this approach the energy is summed (in the many steps) in the vertical direction from the inner lens and compared to the summed flux requirements (in steps) on the horizontal zone 40z. As the cumulative horizontal flux distribution is specified on the horizontal surface and the cumulative vertical flux distribution of the circumferential TIR lens is known, a mathematical mapping can be applied to the refractive exit face 44 to determine its shape. This method is described in more detail for TIR lens in the U.S. patent application Ser. No. 10/726,130, filed Dec. 1, 2003, entitled "Apparatus and Method For Use in Fulfilling Illumination Prescription" Y. Sun, W. Falicoff, and W. Parkyn, incorporated in its entirety herein by reference. The above method and other methods, such as the Simultaneous Surface Methods described in U.S. Pat. No. 6,639,732, incorporated herein by reference in its entirety, can be adapted to solve this problem for the shape of exit face 44 and other similar embodiments described herein.

For example, one embodiment utilizes an integrated flux technique, which can be advantageous where internal rays from TIR facets are nearly parallel in any radial direction. The integrated flux is calculated in the vertical direction which is radially emitted from facets 41 perpendicular to axis 42. Additionally, the integrated flux is determined from an intensity pattern(s) on the horizontal surface 40z along a straight line. It is assumed that the flux is constant within a thin annular ring. The angular output at each point on the surface 44 is then determined using the integrated flux method of nonimaging optics. Snell's law is used to determine the tilt of the surface at each point on the surface 44 so as to correctly direct and/or aim the ray bundle into the correct annular ring on the surface 40z. Other similar methods can be employed in tailoring the exit face 44. Based on the present disclosure, one skilled in the art will be readily capable of determining and implementing an exit face tailored to provide uniform illumination in accordance with a selected light source without undo experimentation.

Figure 5:
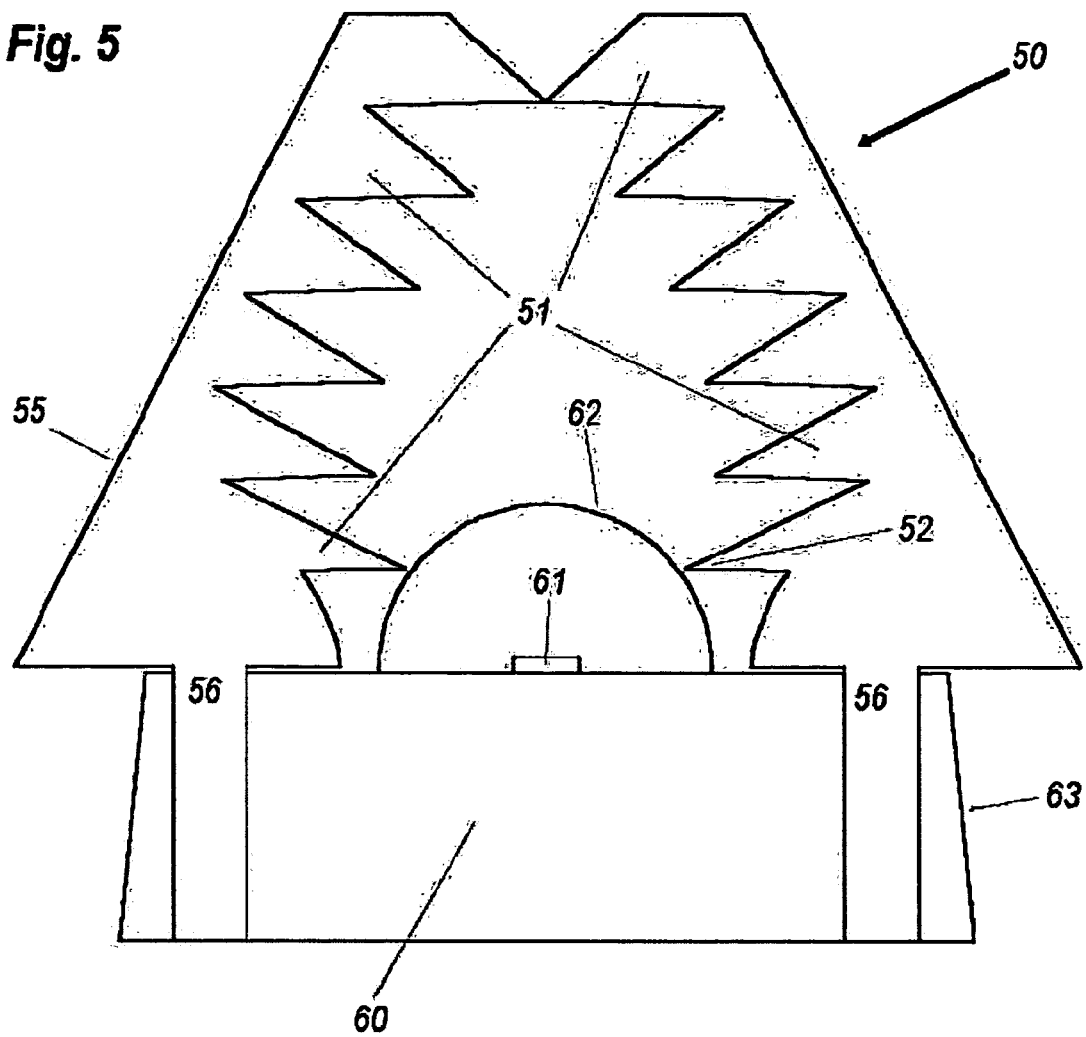
FIG. 5 is a cross-section of the embodiment of FIG. 4A, showing the 360° swept TIR lens installed on an LED package.

Referring to FIG. 5, a cross-section is show of TIR lens 50, showing facets 51 and conical exit surface 55. LED package 60 has luminous chip 61 immersed in clear dome 62. Package base 63 has snap-grooves to admit mounting pegs 56 that protrude from the bottom of lens 50. The size of lens 50 relative to LED package 60 is determined by the size of innermost facet tip 52 being sufficient to clear dome 62. Exit surface 55 can be tailored to laterally deflect the near-field luminous emission from chip 61 in order to illuminate a nearby plane (not shown).

In FIG. 5, the interior angles of facets 51 prevent a straightforward injection molding of lens 50. Molding the lens in halves, however, is straightforward.

Figure 6:
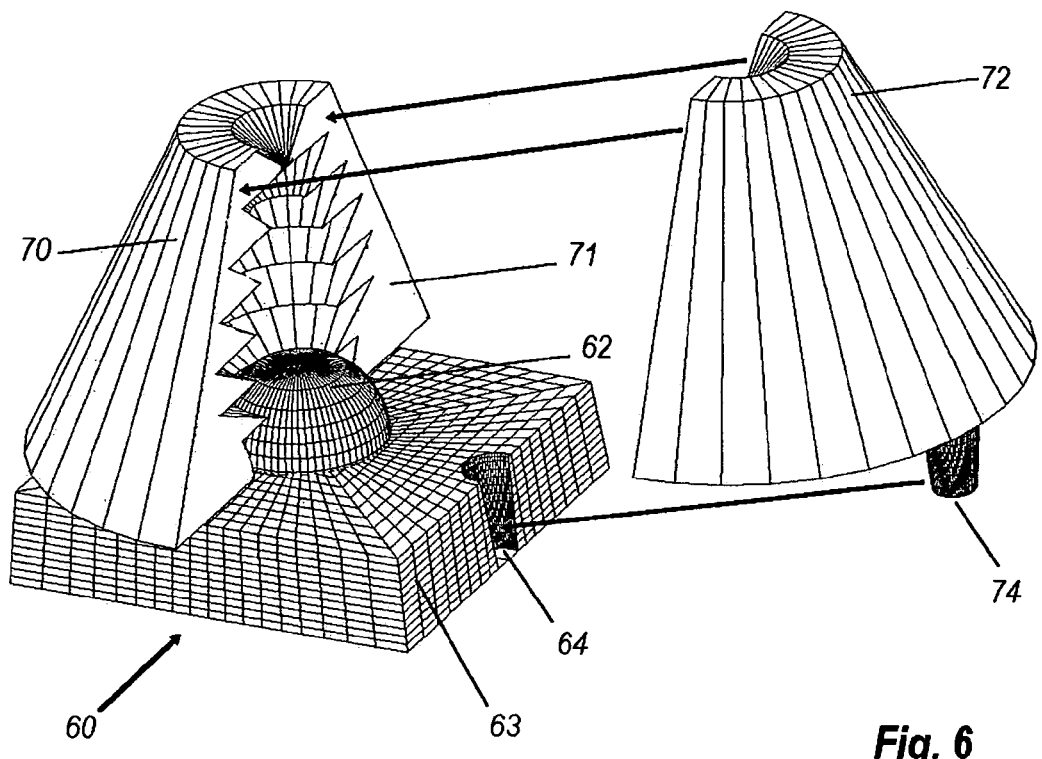
FIG. 6 shows a split-lens variation of the lens of FIG. 5.

Referring to FIG. 6, shown is a LED package 60 with light emitting dome 62 and slanted side 63 with conical slot 64. Semi-lens 70 is shown in position on package 60, with cross-section shaped flat face 71 exposed to view. On semi-lens 72 can be seen peg 74, shaped to snap-fit into slot 64. Ultrasonic welding is one means of joining semi-lens 72 to semi-lens 70, fusing them at face 71. The availability of such LED packages on reels makes for easy automation of such lens mounting.

Alternatively, the process of two-part injection molding can separately mold two semi-lenses, then realign and fuse them before they have cooled off, as disclosed on page 1254 of *Injection Molding Handbook*, 3$^{rd}$ edition (2000) by Kluwer, incorporated in its entirety herein by reference. Another approach is to employ the injection molding process known as fusible or soluble core molding. This process utilizes a central mold-plug made of a low melting temperature metal to give shape to interior features of a part. Plastic is molded about the metal plug and the plastic/metal part is then ejected. The metal plug is then removed by melting it (for example using a heated solvent bath) at temperature which does not damage the plastic. This is accomplished by fabricating the mold-plugs out of a eutectic mixture, such as Tin-Bismuth that is solid during the first phase of injection, but melts at a lower temperature as the eutectic phase change occurs. A pertinent reference is *Plastic Part Design for Injection Molding*, by Malloy Robert, published by Hanser in 1994, incorporated in its entirety herein by reference. This reference also describes collapsible-core molding, another candidate technique for such unreleasable configurations. All these recently developed manufacturing techniques are important enablers of several embodiments.

Figure 7:
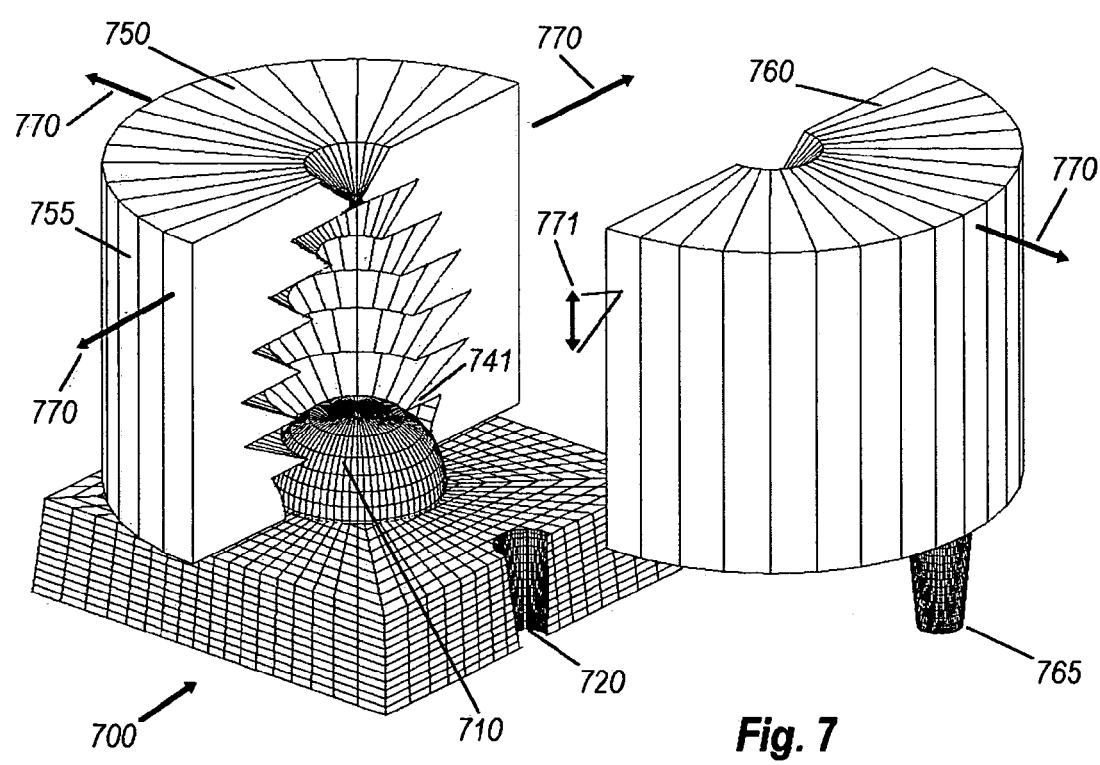
FIG. 7 shows a further variation of the 360° swept TIR lens of FIG. 6, shaped for equatorial beam forming.

Circumferential illumination in the horizontal plane is desired, for example, with masthead lights on boats, with a ±7° beam of white light for powered boats and ±25° for sailboats and buoys, and other similar uses. High-powered white LEDs, such as those sold by Lumileds, of San Jose, Calif., have enough lumens (10–20) to meet the requirements for one, two, and even three-mile lights when incorporated with the present embodiments. FIG. 7 shows one preferred embodiment for these applications.

Adjustment of the beam divergence angle and maximum intensity can be handled by several mechanisms. In order to achieve a very tight beam divergence angle, the size and shape and output characteristics of the source are first established. The laws of nonimaging optics can then be applied to determine the minimum height of the circumferential optic that is to be used to achieve a desired degree of beam collimation. In some embodiments, the laws relating to the Conservation of Etendue are used to determine the minimum size of the optic. A safety margin is normally applied as optic typically do not performs as well as a theoretically perfect optic. As such, the actual size of the optic are larger than the theoretically solution in some implementations. A ray trace of the proposed design is used to determine requirements are meet. The maximum intensity output from an optic is related to its flashed area of aperture and the luminance of the source. This fundamental relationship is also well known to those skilled in nonimaging optics and is used in combination with other laws in the field to determine the appropriate size of the optic.

Beam divergences much greater than the theoretical limits are achieved in some embodiments by adjusting the design of the facets of the circumferential TIR, using methods known to those skilled in the arts of traditional TIR lens design. For example, to increase the beam divergence the slope of the rear face of the TIR face is adjusted and/or changed. Another approach that is employed in some implementations includes changing the position of the facets so that they are either closer (increased divergence) or further away (decreased divergence) from the source. Similarly, the slope of the refractive face on the TIR facet is also adjusted in some instances as needed.

Referring to FIG. 7, shown is a depiction of a high-power LED 700 that has an emitting dome 710 and mounting slots 720. Semi-lenses 750 and 760 mount onto LED 700, with peg 765 snapping into slot 720. Other means for securing the semi-lenses can also be employed. Vertical exit face 755 gives a horizontal, equatorial emission, as shown by arrows 770. The lens shown is the smallest possible in order for innermost facet-tip 741 to clear dome 710. However, other sized lenses can be utilized without departing from the inventive aspects of the present embodiments. The total output pattern represented by horizontal arrows 770 would actually extend in 'latitude', as shown by vertical arrow 771, which represents the ±25° required by the U.S. Coast Guard for white masthead lights for sailboats. With a 20 lumen output from the LED, a single such device could meet the Coast-Guard standard for three miles, something currently requiring much larger devices. Lenses that are larger relative to the light-emitting diode would typically have narrower equatorial emission.

Figure 8:
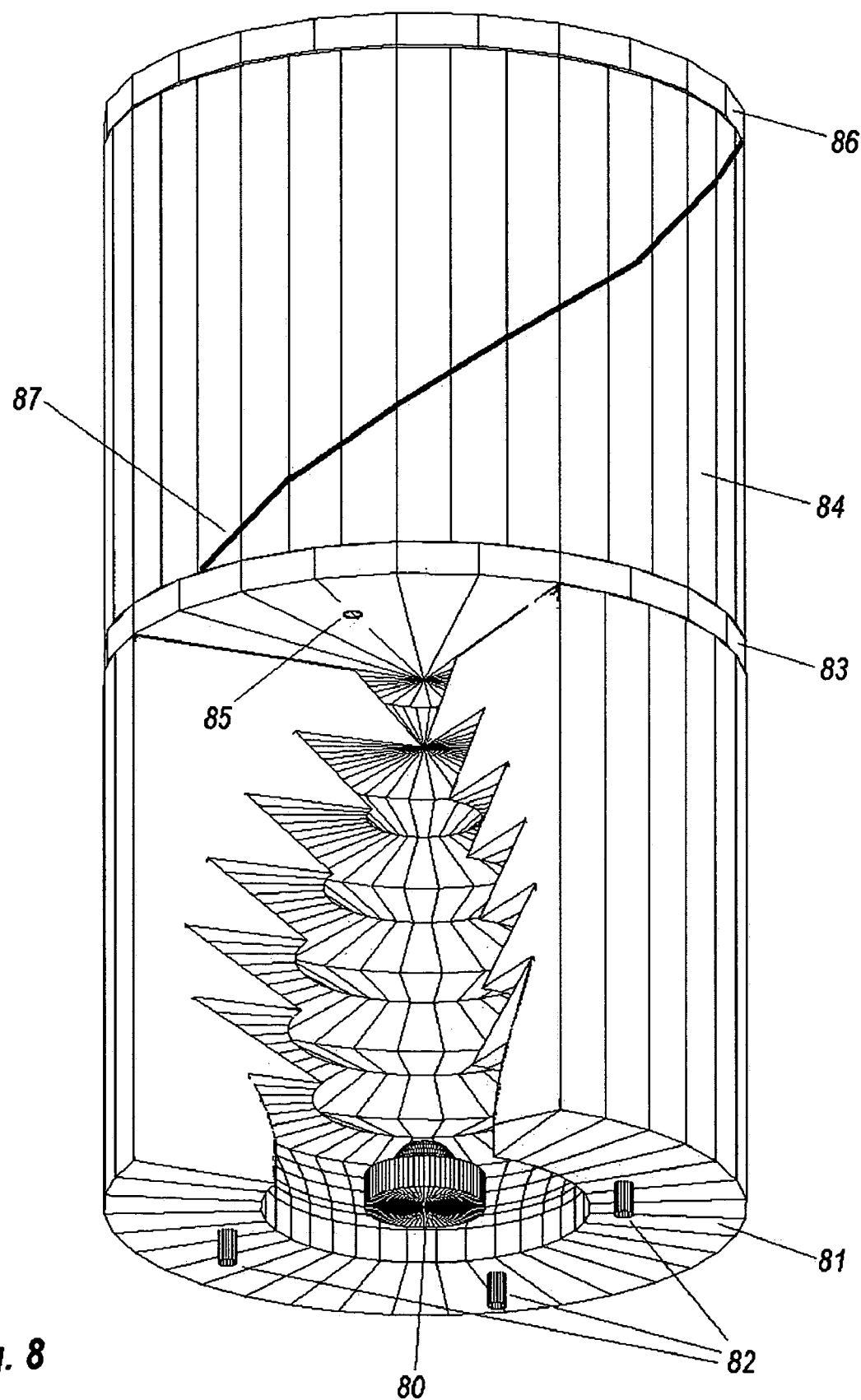
FIG. 8 shows a vertical stack of equatorial beam forming lens, such as the further variation of the 360° swept TIR lens of FIG. 7, for high-candlepower applications.

Referring to FIG. 8, shown is a depiction of the use of larger lenses relative to the light source 80. High-power LED package 80 is at the focal zone of internally faceted 360° lens 81, illustratively cutaway, and shown with three of four mounting pegs 82. Circular circuit board 83 is shown mounted atop lens 81. Lens 84 is identical to lens 81, and has its own LED package (not shown). Lens 84 is mounted in turn atop circuit board 83. Such mounting is via circuit-board holes, a typical one shown at 85. Next circuit board 86 is mounted atop lens 84 to show the stacking method continuing. Mounting pegs (not shown) also protrude from the top of lens 84. A circuit board for LED 80 and first lens 81 is not shown for the sake of clarity. To convey electrical power, spiral conduit 87 winds an integral number of turns along an entire stack, so as not to cast any shadows on its 360° pattern.

U.S. patent application Ser. No. 10/269,479, by Miñano & Benitez, as well as U.S. patent application Ser. No. 09/810, 959 by Miñano, Benitez, Gonzalez, Falicoff and Caulfield, both incorporated in there entirety herein by reference, disclose the design of lens profiles by the simultaneous multiple surface (SMS) method. The SMS method performs a conjoint successive generation of two optically active surfaces in a system. The present embodiments utilize edge rays, bundles thereof, and segments of generalized Cartesian ovals such that a source's output is transformed to fulfill an illumination task, given particular initial conditions such as lens size relative to the source.

The SMS method in some implementations is a two-dimensional SMS method that begins with an analysis of particular characteristics of an LED light source, array of LEDs, or a source of other type, and how its construction and/or appearance varies with direction relative to a package axis. A two dimensional radial profile is defined according to the source rays, through the SMS method that defines lens surfaces relative to each other to achieve the desired output emission. The generated radial profile is used to define a three dimensional lens by rotationally sweeping the profile about a central axis. An edge ray is a ray or rays of a beam or source that represent the source's angular or spatial extremes and thus form the source's phase-space boundary. Besides such rotationally symmetric lenses, the present embodiments can be configured with some small departures from such symmetry. This allows the profile to undergo modest changes during the rotational sweep, and allows the accommodation of asymmetric illumination prescriptions.

Figure 9:
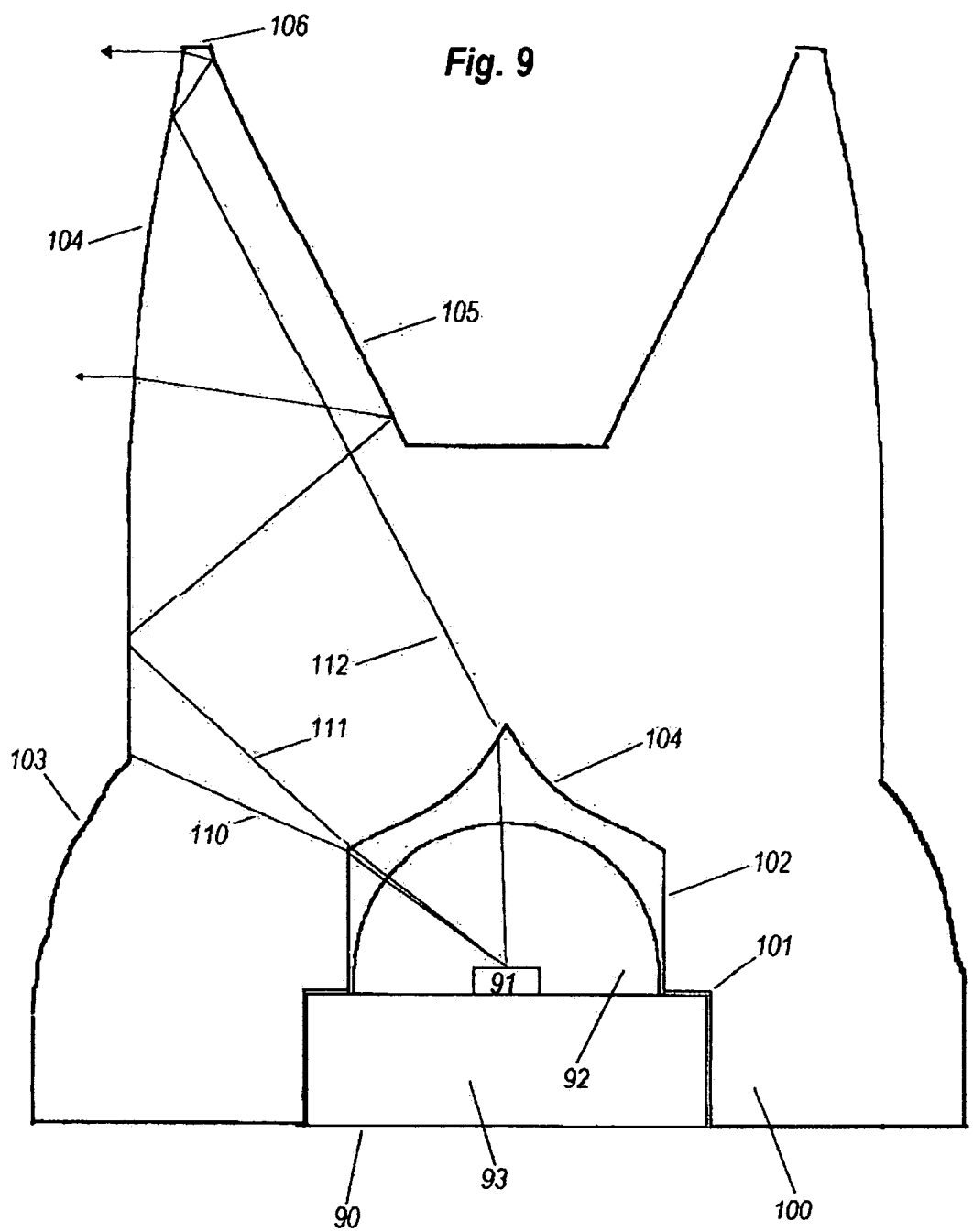
FIG. 9 shows another variation of the 360° swept TIR lens of FIG. 8 shaped as a compact equatorial beam forming lens with a reflective coating.

Referring to FIG. 9, shown is an illustration of a profile designed by the SMS method for transverse-axis sweeps. FIG. 9 shows high-power LED 90 with emitting chip 91 and transparent dome 92. Folded-optic lens 100 surrounds LED 90 and sends its light output into a narrow equatorial beam. An input surface 109 of the folded-optic lens 100 define a cavity that surrounds LED 90. In some preferred embodiments, negative draft angles are not necessary, so that lens 100 can mold-release as a single piece. Recess 101 admits base 93 of LED 90. Cylindrical section 102 of input surface 109 acts to deflect and/or refract rays into a less upward course, such as uppermost ray 110, so they are intercepted and equatorially collimated by outer tailored refractive section 103. Other beams intersecting the lower refractive section 103 are refracted and/or deflected to provide part of the equatorial collimated output. Vaulted section 104 acts to laterally refract upward-going rays, those lying between rays 111 and 112. These rays internally reflect off upper exterior section 104, showing the folding action of lens 100. Inner recessed surface 105 is metalized to act as a reflector, sending the rays back outwards to be refracted into an equatorial beam by outer surface 104. Optically inactive upper surface 106 allows the same modular vertical stacking as that shown in FIG. 8.

A more compact RXI profile than that of FIG. 9 is possible with a metalized reflector on part of the exterior, where RXI is an acronym defined from an exit beam back inwards to a source, where there is refraction (R), reflection (X), and internal reflection (I). In some embodiments an air gap is maintained between the source (e.g., the dome surface of the source) and the input surface 109. This air gap can provide added control of the light entering the lens 100 by providing an initial defined refraction. New techniques of in-mold metalization enable such a reflector to be produced in its mold, rather than in a separate and expensive vacuum process. First a metal reflector "plug" of a suitable material is produced using the Metal Injection Molding process. This is described on pages 1266 to 1268 of the above-mentioned *Injection Molding Handbook*. This process is cheaper than casting and can produce an extremely accurate part. The permanent metal reflector plug is then used in an Insert Molding, Inmolding, or similar process where the plastic part is injected over the previously made reflector plug.

Figure 10:
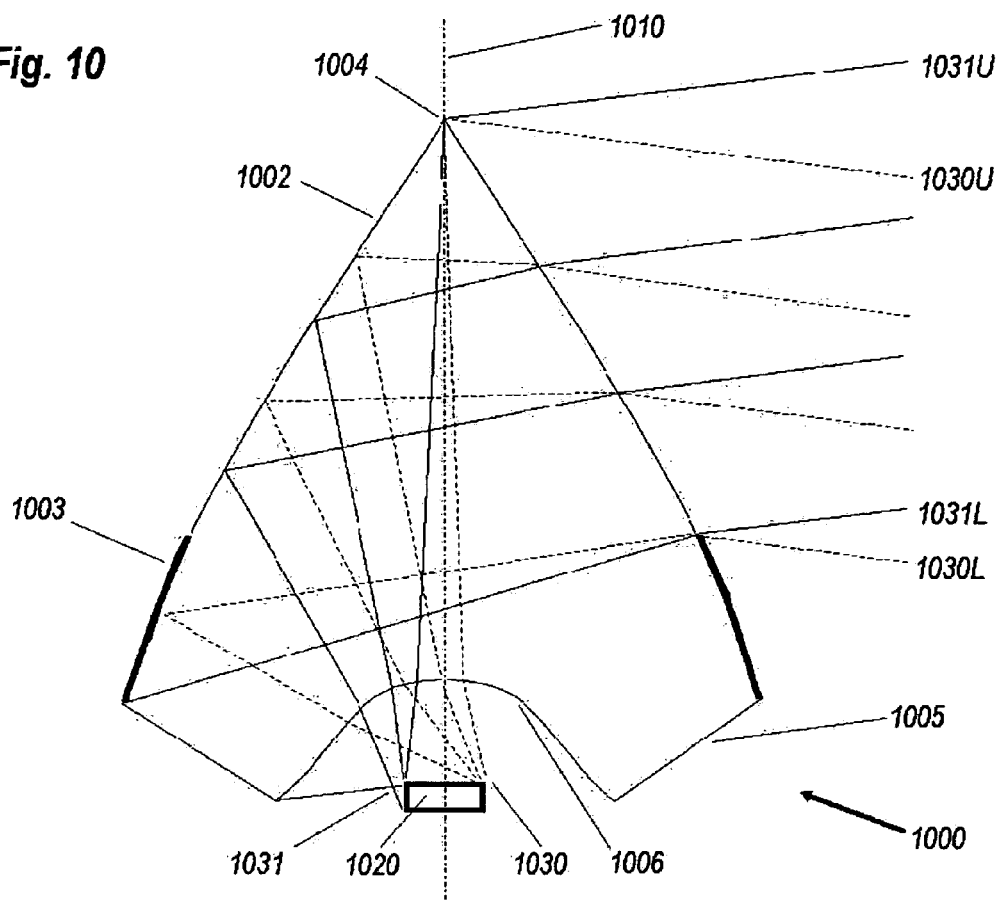
FIG. 10 shows an additional variation of the 360° swept TIR lens of FIG. 9 shaped as another equatorial lens with a reflective coating.

Referring to FIG. 10, a cross-section view is shown of conicoid lens 1000, circularly symmetric about vertical axis 1010, and organized about virtual source 1020. The surface of lens 1000 comprises slightly curved conicoid upper section 1002, inwardly sloping inactive section 1005, and source-tailored interior surface 1006. Upper surface 1002 has metalized lower portion 1003 and uppermost vertex 1004. Rectangular virtual source 1020 represents a luminous emitter, such as in FIG. 9 with LED 91 in dome 92 of LED package 90. In this case the size of virtual source 1020 of FIG. 10 is that of LED 91, but magnified by the refractive index of dome 92, of FIG. 9. For the sake of clarity the corresponding dome and package are not shown, but the mathematical equivalent of the emitting diode is shown, namely virtual source 1020. The size of inner surface 1006 is selected so as to enclose such a dome. The distance from virtual source 1020 to vertex 1004 can be increased to generate a larger device with a narrower equatorial output.

In FIG. 10, the results of the SMS method of profile design can be seen in the behavior of the example of rays drawn, where a right ray-fan 1030 is shown with dotted lines and a left ray-fan 1031 is shown with solid lines. The SMS method ensures that each ray-fan gives rise to rays exiting generally in parallel. For example, some embodiments emit beams with rays from the left ray-fan 1031 being emitted above-horizontal, from upper ray 1031U to lower ray 1031L. Similarly, rays from the right ray-fan 1030 being emitted below-horizontal rays, from upper ray 1030U to 1030L. Optically inactive bottom surface 1005 can include, in some implementations, mounting pegs, similar to peg 74 of FIG. 6.

The SMS method can also generate a profile that will give the emitted rays a net direction away from horizontal.

Figure 11:
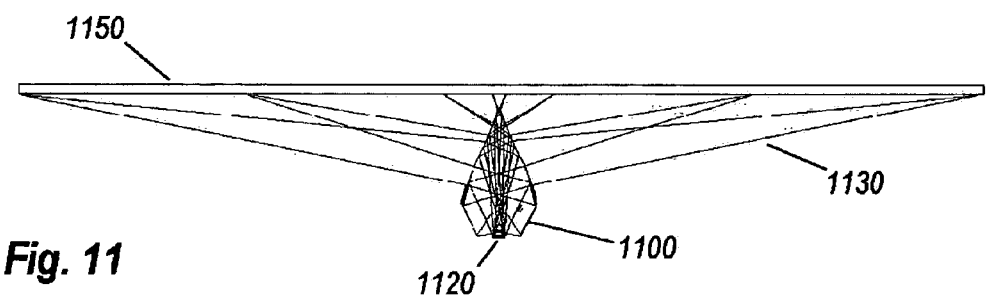
FIG. 11 shows yet a further additional variation of a proximal-illumination version of the 360° swept TIR lens of FIG. 10.

FIG. 11 shows is a cross-sectional view of a conicoid lens 1100 that closely resembles lens 1000 of FIG. 10, but with a narrower aspect ratio. The narrow aspect ratio gives the output rays 1130 a net directional deflection (e.g., in an upward direction as shown in FIG. 11), forming a conical pattern that uniformly illuminates a nearby plane 1150. A more distant plane could similarly be illuminated as well, or any other such wide-angle circularly symmetric illumination task. Light source 1120 could, for example, be a programmable red-green-blue (RGB) LED, or a high-power white LED.

The SMS method can also generate profiles that do not utilize a metallic coating.

Referring to FIG. 12, shown is an immersive lens i.e., one that is glued or otherwise bonded to the transparent part of an LED package so LED rays meet no air gap as they enter the lens. FIG. 12 shows lens 1200 circularly symmetric about vertical axis 1210 and organized about LED 1220. For the sake of clarity, an LED dome such as dome 92 of FIG. 9 is not shown accompanying LED 1220. Because lens 1200 has negative drafts in both horizontal and vertical directions of mold release, it is molded in two separate parts to be joined thereafter. Such a joining can be by optical adhesive, ultrasonic welding, or the two-part molding process already described. Lens 1200 comprises lower lens 1202 and upper lens 1204, joined along dotted line 1203. About axis 1210, lower lens 1202 is a surface of revolution with profile comprising join line 1203 above and outer quasi-ellipse 1205. Also about axis 1210, upper lens 1204 is a surface of revolution with profile comprising join line 1203 below, inactive optical surface 1206 extending outward therefrom, optically folding lower surface 1207 continuing further outward, upper internally reflecting surface 1208 returning inward, and innermost pointed surface 1209, functioning substantially identically to surface 1002 of FIG. 10. The directional uniformity that is the hallmark of SMS-designed profiles is apparent in the dotted rays of right ray-fan 1230 and the solid-lined rays of left ray-fan 1231. Note that the rays deflected by upper profile 1209 are inverted in vertical direction and reversed right for left from rays deflected by lower surfaces 1207 and 1208.

Referring to FIG. 13, another SMS profile with no metallic reflector is shown, with lens 1300, comprising lower section 1302 and upper section 1304, joined on line 1303. Lower section 1302 has optically active outer lens of revolution 1305. Upper section 1304 comprises upward slanted folding-optic surface 1307 and upper internally reflecting surface 1308, interrupted by optically inactive surface 1306. Upper peaked surface 1309 functions identically to surface 1209 of FIG. 12. Optically immersed LED chip 1320 emits right ray-fan 1330 and left ray-fan 1331, the members of which can be seen to be exiting lens 1300 in parallel with those exiting surface 1309 inverted and reversed relative to those emitted by surfaces 1307 and 1308.

Figure 14:
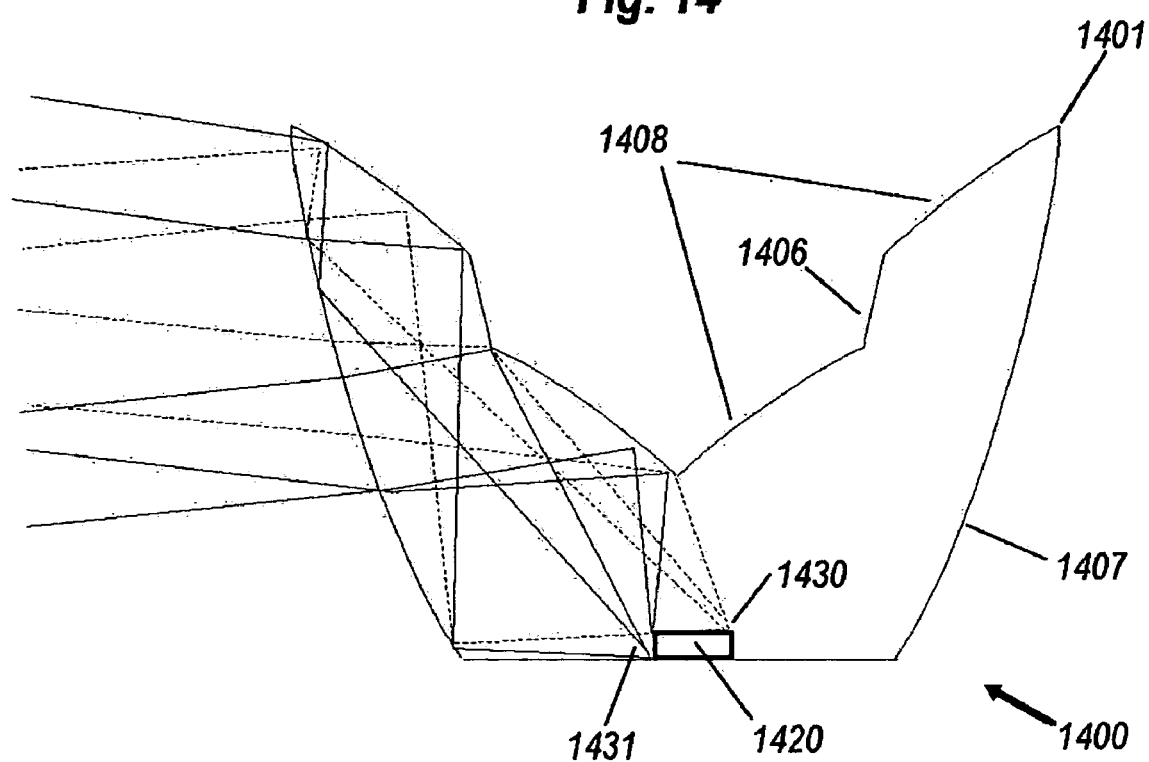
FIG. 14 is a further added variation of the 360° swept TIR lens of FIG. 12 shaped from an SMS collimator converted to an equatorial lens.

Referring to FIG. 14, and continuing with SMS designs, a cross-section view is shown of circularly symmetric lens 1400, which can be molded in one piece. Lens 1400 comprises curved folded-optic outer surface 1407, extending upwards steeply enough to internally reflect all rays from LED source 1420. The SMS method generates the profile of 1407 together with that of upper reflecting surface 1408, which is interrupted by optically inactive surface 1406, to reduce lens volume and give it more uniform thickness. The dotted lines of right ray-fan 1430 and the solid lines of left ray-fan 1431 can each be seen to exit in parallel out folded-optic surface 1407, the hallmark uniformity of the SMS method. Lens 1400 is suitable for a shape of an LED package itself, provided the production method has good optical accuracy.

The embodiments of FIG. 4 to FIG. 14 have 360° circumferential illumination, and the light source of each is aligned to shine upwards along the axis of circular symmetry. Other illumination situations, however, call for the same 180°-sweep as shown in FIG. 3. Some examples are wall-mounted safety lights and outdoor path-lighting.

Figure 15A:
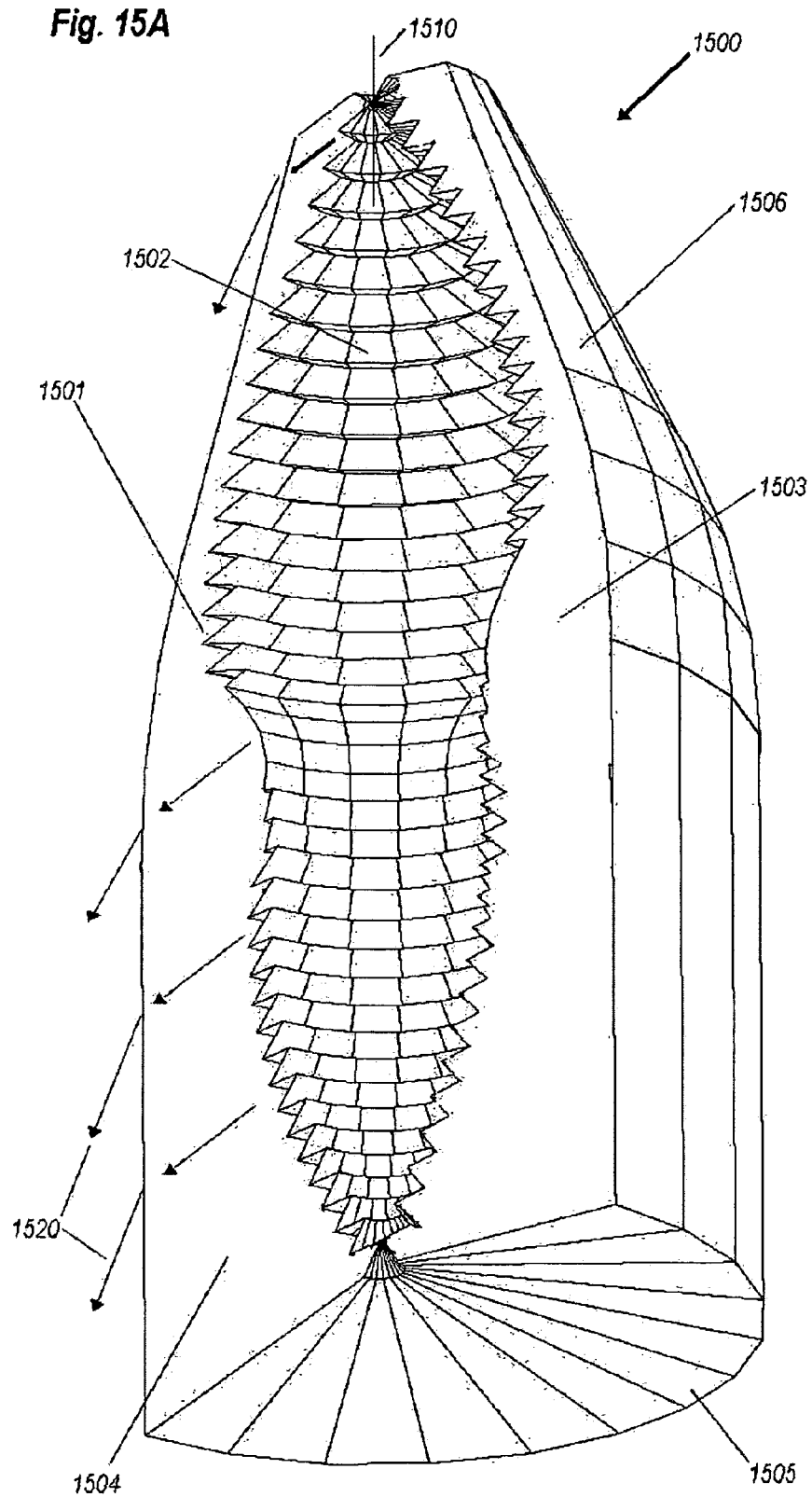
FIG. 15A shows a 180° sweep for a 360° swept TIR lens of FIG. 14 shaped as a variation of the transverse-axis TIR lens that sends light downward.

Referring to FIG. 15A, semi-circular transverse-axis lens 1500 is shown, incorporating asymmetric TIR lens profile 1501 in accordance with U.S. patent application Ser. No. 60/319,746 by Miñano, Falicoff, Benitez, Parkyn, Chaves and Sun, which is incorporated herein by reference in its entirety. Profile 1501 is swept 180° about vertical axis 1510 to form recessed faceted cavity 1502. The exterior surfaces of lens 1500 comprise right flat surface 1503, left flat surface 1504, conical bottom surface 1505, and bullet-shaped exit surface 1506, tailored in shape to adjust down-going rays 1520. Rays 1520 have the same downward angle inside lens 1500, but the shape of external surface 1506 gives them a distribution of angles downward, for illumination of a proximal horizontal surface.

Referring to FIG. 15B, a view is shown from a greater distance of lens 1500 installed on post 1550. Annular illumination zone 1560 is illuminated with higher concentration in the center of the illumination output profile, denoted by small line spacing 1561 and very little at the edges, denoted by large line spacing 1562.

The above preferred embodiments produce circumferential emission for several applications. Such emission, however, can also be redirected back along the axis of circular symmetry to form a collimated beam.

Figure 16:
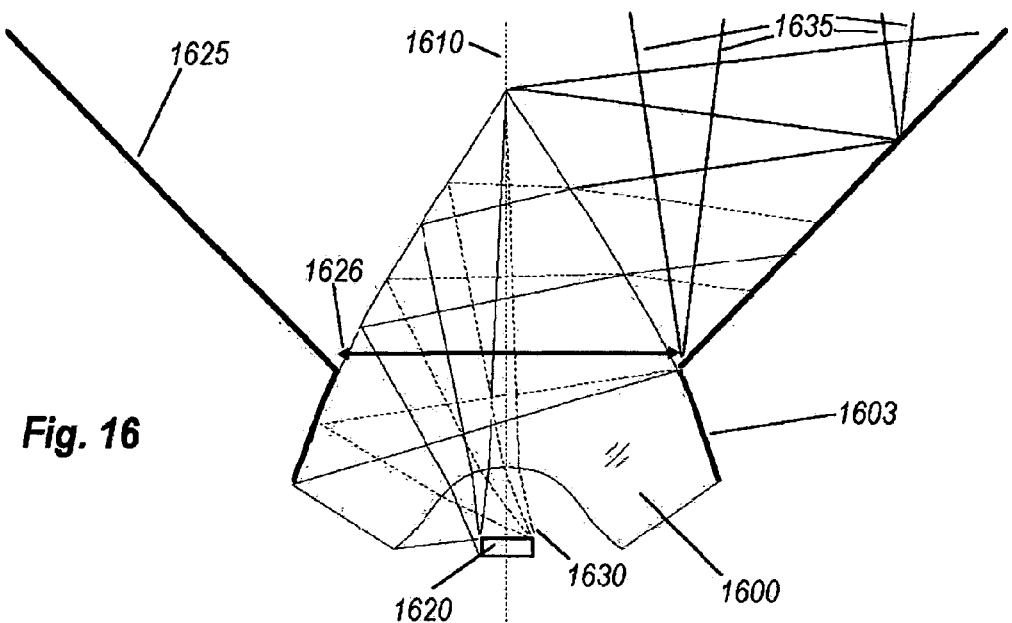
FIG. 16 shows the 360° swept TIR lens of FIG. 10 plus an external conical reflector for collimation.

Referring to FIG. 16, the lens of FIG. 10 combined with a conical reflector is shown. The lens 1600 is circularly symmetric about a vertical axis 1610 and has an LED chip 1620 as its source and a metallic surface 1603 with reflective coating. A conical mirror 1625 has an inner diameter 1626 matching a top of coating 1603. A 45° angle of the conical mirror 1625 transforms source rays 1630 into a collimated output beam 1635. Such a beam has a central hole of an inner diameter 1626, an inevitable byproduct of conically transforming a circumferential beam into a parallel one. Other angles for reflector can be used to produce the beam resulting in an output beam without central hole. Some of these angled reflectors, however, may not provide collimated beams and typically have a greater beam divergence.

Figure 17:
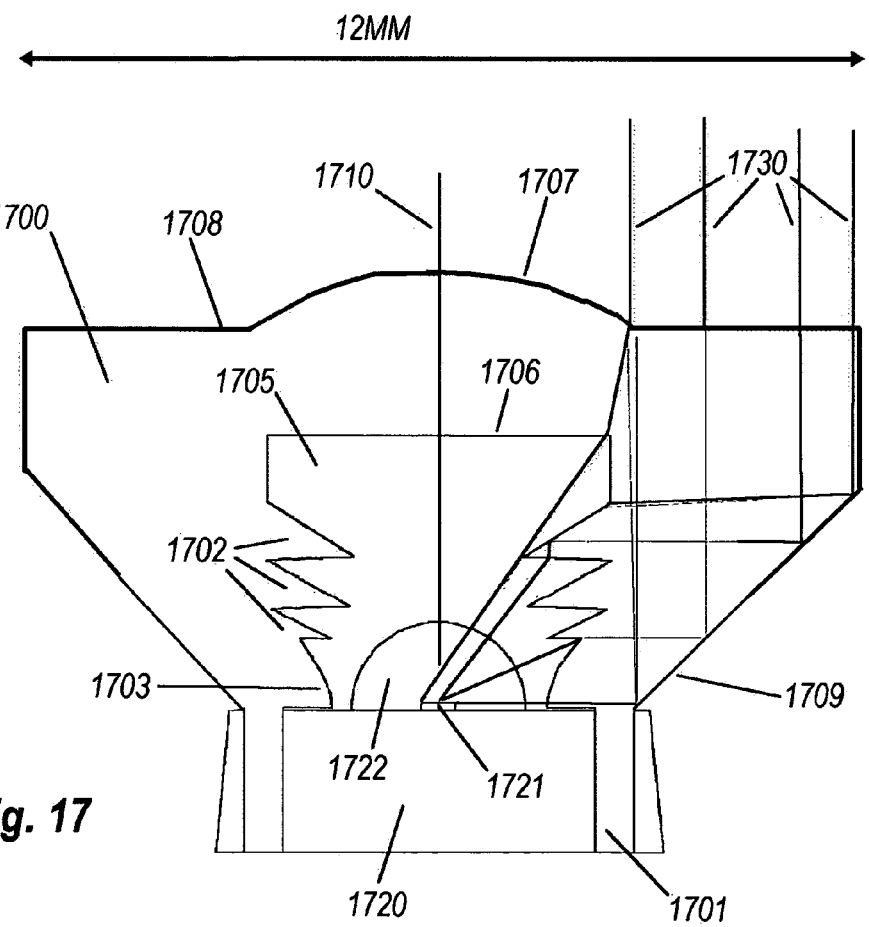
FIG. 17 shows a variation of the 360° swept TIR lens of FIG. 16 wherein a collimating lens is comprised of a transversely swept TIR lens with one external facet.

Referring to FIG. 17, a different approach to this transformation is shown. Lens 1700 is circularly symmetric about vertical axis 1710 and focused on LED chip 1721 of LED, which is immersed in transparent dome 1722 of LED package 1720. Lens 1700 has lower pegs 1701 that function similarly to peg 74 of FIG. 6. Within interior cavity 1705 are deployed facets 1702, and below them is toroidal lens 1703 generated from a tailored section, which is also making contact with the top of package 1720. Flat surface 1706 is the ceiling of cavity 1705 and acts to refract source rays more inwardly, for collimation by outer bulge 1707. Surrounding bulge 1707 is annular top surface 1708 for the exit of rays internally reflected by conical side 1709. The distance between ceiling 1706 and annular top 1708 allows the light passing through ceiling 1706 to widen enough to fill the hole in cone 1709. The compact size of one embodiment of this device can be the 12 mm shown, and output beam 1730 is uniformly collimated because the various exiting rays have nearly the same total optical path-length from source 1721 to final exit out top surface 1707 or 1708.

For LEDs that have a larger dome 1722 surrounding the LED die than the LED shown in FIG. 17, a collimator near the theoretical limit of divergence can be utilized. In some embodiments, a diameter of the collimated optic can be approximately four times the diameter of the primary dome surrounding the LED. For example, a highly collimated optic for a Lumileds Luxeon LED can have a diameter of about 22 mm. Larger diameters can be utilized when tighter collimation is desired.

Thus with internal faceting comes a substantial improvement over other TIR lenses in regards to uniformity and tightness of collimation. This is because the various elements of the lens are at comparable distances from the source, so that they all generate about the same angular output. This can be seen in FIG. 18, an inside-out version of FIG. 17, sized for high-power LEDs.

Figure 18:
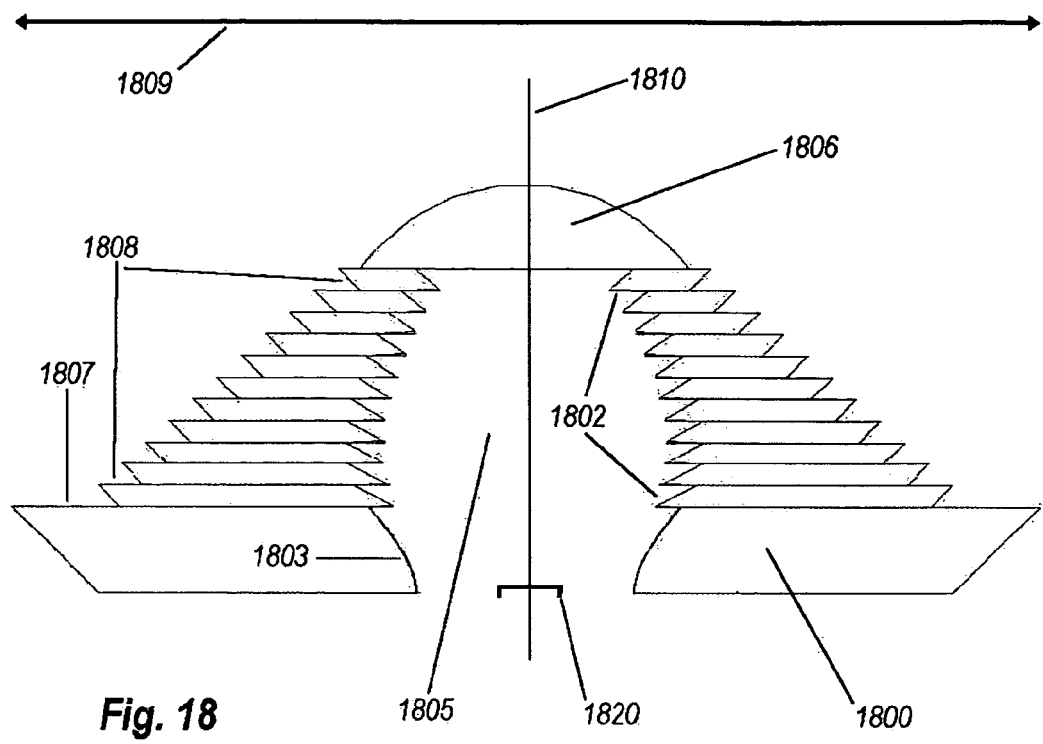
FIG. 18 shows a variation of the 360° swept TIR lens of FIG. 17 wherein a collimating lens is comprised of a transversely swept TIR lens with multiple external facets and a central refractive lens.

Referring to FIG. 18, a cross-section is shown of dual-TIR lens 1800, circularly symmetric about axis 1810 and focused on virtual source 1820, represented by lines at the positions of the emitting sides and top of a typical white-LED chip. Vertically non-releasable internal space 1805 is formed by inner toroidal lens element 1803, which is generated by a circumferentially swept tailored curve, circumferentially swept TIR facets 1802, eleven in number in FIG. 18, and plano-convex top lens 1806.

The exterior of lens 1800 is also faceted, at a constant 45°, from large bottom facet 1807 through multiple facets 1808, surrounding the convex top surface of central lens 1806. Central space 1805 is sized to fit a dome, not shown, such as 1722 of FIG. 17. In this embodiment the outer facets 1807 and 1808 are arranged so that the final "exit" surfaces 1809 of the optic are fully flashed and are without any blockages of one facet to the next. There is a small non-flashed zone just above the topmost inner TIR facet.

The overall diameter of one embodiment of this optic is approximately 22 mm and the device produces an output beam with divergence angle of approximately 3.5 degrees half angle assuming there is a 1 mm by 1 mm square Lambertian emitting source. This is near the theoretical limit set by nonimaging optic principles, which can be applied show that the minimum half divergence angle in this case would be 2.76 degree. This is achieved with a theoretical efficiency of 85%, where efficiency is defined as the amount of the available flux from the source which is within the 3.5 degree half-angle output beam.

Other lenses with alternate dimensions can equally be provided without departing from the inventive aspects of the present embodiments. Further, other designs are possible with the same approach, wherein outer facets 1808 are variable in depth as opposed to the same depth as the internal facets 1802. For example, the topmost outer facet can be designed to be twice the depth of the pitch of the inner TIR lens. This approach can be used to reduce the amount of material in the lens and to make a lens of a more constant wall thickness, a possible benefit in the molding of the part.

Figure 19:
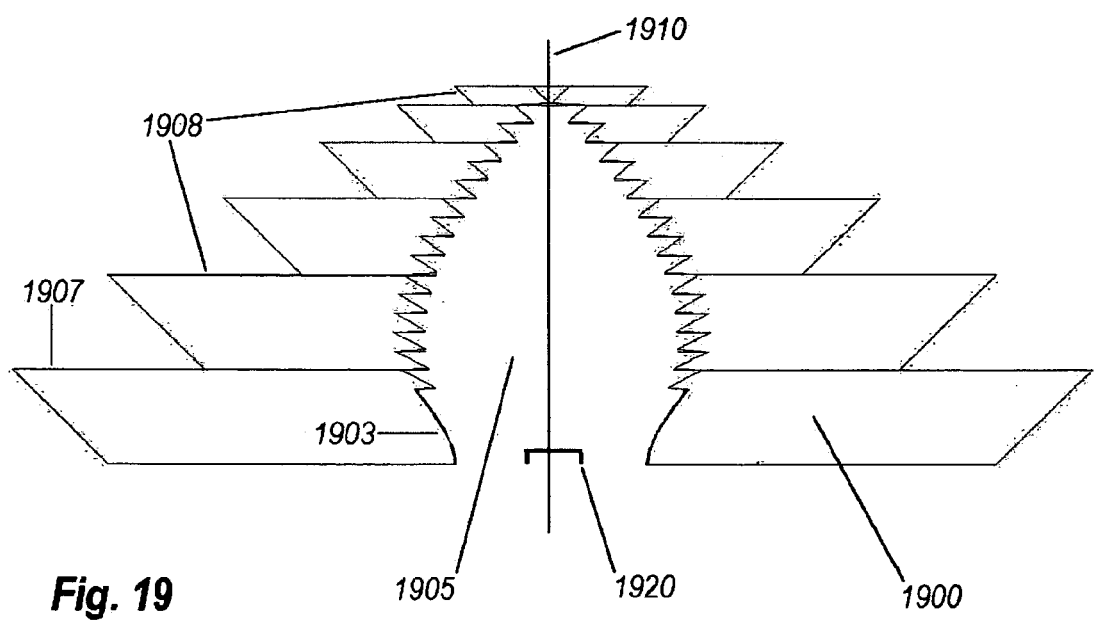
FIG. 19 shows a variation of the 360° swept TIR lens of FIG. 18 wherein a collimating lens comprised of a transversely swept TIR lens with variable-height external facets.

Referring to FIG. 19, shown is an embodiment illustrating this principle. FIG. 19 is a cross-sectional side view of dual-TIR lens 1900, circularly symmetric about axis 1910 and focused on virtual source 1920, represented by lines at the positions of the emitting sides and top of a typical white-LED chip. Vertically non-releasable internal space 1905 is formed by inner toroidal lens element 1903, which is generated by a circumferentially swept tailored curve, circumferentially swept TIR facets 1902, sixteen in number in FIG. 19. The exterior of lens 1900 is also faceted, at a constant 45°, from large bottom facet 1907 through eversmaller facets 1908. Central space 1905 is sized to fit a dome, not shown, such as 1722 of FIG. 17.

Further, each outer TIR facets can be designed using a specific tailored shape, as can the exit aperture of each outer TIR facets. The SMS method can be employed to design these facets, in order to further improve output uniformity, cutoff, or to tailor a device to achieve a particular intensity profile in the near or far field.

In some embodiments, an illumination lens is provided that comprises a surface of revolution that forms a circumferential, lighthouse-like output. Its axis of revolution is transverse to its profile, so that its output beam is directionally swept around the same axis along with the lens profile that generates it. Thus an equatorial emission pattern is formed, with up to 180° and/or 360° circumferential sweep. Embodiments include waveguide injection, proximal illumination, and far-field intensity prescriptions. Also, such a circumferential lens can combine with external faceting to give a dual-TIR collimator lens.

While the invention herein disclosed has been described by means of specific embodiments and applications thereof, numerous modifications and variations could be made thereto by those skilled in the art without departing from the scope of the invention set forth in the claims.

What is claimed is:

1. An illumination lens comprising:
   a two-dimensional beam-forming lens-profile where the profile acts to deflect light rays from a light source into a relatively narrow output beam;
   the lens-profile encloses a zone of higher refractive index than that of the area outside the profile where the higher refractive-index zone admits the light rays;
   a transverse axis of revolution extending transversely across and outside of the lens-profile so that transverse axis extends substantially laterally with respect to a luminous centroid-direction of the output beam;
   a surface of revolution formed by circularly sweeping the lens-profile about the axis of revolution forming a circumferential beam from the output beam emitted by said surface of revolution;
   wherein the lens-profile comprises totally internally reflecting facets.

2. The lens of claim 1, wherein the lens-profile comprises a relatively small focal zone from which the light rays diverge with a relatively wide angular swath such that the profile deflects the light rays from said focal zone into the relatively narrow output beam; and
   the transverse axis of revolution passes through the focal zone.

3. The lens of claim 2, further comprising:
   a focal volume defined about the focal zone by the sweeping of the lens-profile about the axis of revolution.

4. The lens of claim 3, wherein the focal volume is defined to receive a light source positioned at the focal zone.

5. The lens of claim 2, wherein said light source is a light-emitting diode.

6. The lens of claim 5, wherein said light-emitting diode is oriented so that the radiant-centroid of light emissions from the light-emitting diode is parallel to said transverse axis.

7. The system of claim 5 wherein said light-emitting diode is oriented so that the radiant-centroid of light emissions from the light-emitting diode is perpendicular to said transverse axis.

8. The lens of claim 1, wherein the focal volume defined through the sweep of the lens-profile defines a cavity at an edge of the lens to admit and distribute the light rays from the light source.

9. The method of claim 1, further comprising:
   a reflector positioned about at least a portion of the output surface to reflect at least a portion of an output beam exiting the output surface to direct the at least the portion of the output beam in a direction substantially parallel with the axis of symmetry.

10. The lens of claim 1, wherein said lens-profile is bilaterally symmetric about a line perpendicular to said transverse axis.

11. The lens of claim 1, wherein said circular sweep is through 360°.

12. The lens of claim 1, wherein said circular sweep is through 180°.

13. The lens of claim 1, wherein at least the output surface tailors said circumferential beam to illuminate a nearby surface.

14. The lens of claim 1, wherein at least the output surface tailors the circumferential output beam such that the circumferential beam conforms to a far-field intensity prescription.

15. The lens of claim 14, at least the output surface tailors the circumferential output beam such that the circumferential beam has a beam divergence of at least about ±7° and an intensity to be visible for at least one mile.

16. The lens of claim 14, wherein at least the output surface tailors the circumferential output beam such that the circumferential beam is shaped to conform to the angular form meeting predefined standards.

17. The lens of claim 16, wherein the two-dimensional beam-forming lens-profile comprises profiles of a plurality of lenses stacked along the axis of revolution where the profiles of the plurality of lenses deflect light rays from a plurality of light sources.

18. A method for generating a lens, comprising:
    defining a two dimensional profile having an output surface and an input surface;
    defining an axis of symmetry; and
    circularly sweeping the profile about the axis of symmetry defining the output surface in three-dimensions, wherein the output surface is radially distanced substantially laterally with respect to the axis of symmetry, where at least a portion of the output surface both internally reflects light, and refracts light exiting the output surface.

19. The method of claim 18, further comprising:
    a reflector positioned about at least a portion of the output surface to reflect at least a portion of an output beam exiting the output surface to direct the at least the portion of the output beam in a direction substantially parallel with the axis of symmetry.

20. The lens of claim 18, wherein said lens-profile defines an airgap-RXI lens.

21. The method of claim 18, wherein the circularly sweeping includes circularly sweeping the profile up to 360 degrees.

22. The method of claim 18, wherein the defining the two dimensional profile comprises:
    defining the input surface;
    defining dual semiconic surfaces; and
    defining the output surface, with the dual semiconic surfaces extending in a direction from the input surface toward the output surface.

23. The method of claim 22, wherein the sweeping comprises rotationally sweeping the two dimensional profile defining the output surface such that light emitted from the output surface is substantially perpendicular to the axis of symmetry.

24. The method of claim 18, wherein the defining the output surface comprises defining a conicoid output surface that tapers toward the axis of rotation.

25. The method of claim 26, wherein the output surface refracts light emitted from the output surface and establishing an output light prescription that illuminates a plane substantially perpendicular to the axis of rotation.

26. The method of claim 18, further comprising:
    defining an internally reflective surface positioned relative to the output surface such that at least a portion of light reflects from the internally reflective surface and is directed to fit output surface.

27. The method of claim 26, wherein the defining the output surface comprises:
    defining a first refractive section;
    defining a second vaulted section extending from the first refractive section and positioned relative to the internally reflective surface to receive light reflected from the internally reflective surface.

28. The method of claim 27, wherein the defining a two-dimensional profile comprises simultaneously defining multiple surfaces such that the defined input surface, reflective surface and output surface are interdependent.

29. A method for generating a light output, comprising the steps of:
- retracting initial light through facets of an input surface;
- internally reflecting the light; and
- again refracting the light producing an output light that is circumferentially emitted.

30. The method of claim 29, further comprising:
- defining the input surface such that the input surface includes the facets.

31. The method of claim 30, wherein the defining the input surface comprises defining a cavity into which a light source is positioned.

32. The method of claim 29, further comprising:
- joining two three-dimensional optical devices providing an optical device that is substantially symmetrical for 360° about rotational axis.

33. The method of claim 32, further comprising:
- stacking three-dimensional optical devices that are substantially symmetrical for 360° about rotational axis.

34. The method of claim 29, wherein the again refracting comprises producing the output light that is at least partially lateral with respect to an axis of revolution.

35. The method of claim 34, wherein the step of internally reflecting the light includes totally internally reflecting the light.

36. The method of claim 35, wherein the axis of revolution is substantially lateral with respect to a luminous centroid-direction of the output light.

37. An apparatus for use in directing an output beam, comprising:
- a two-dimensional profile;
- an axis of symmetry;
- a three-dimensional volume defined by rotating the two-dimensional profile about the axis of symmetry through 180°; and
- an output surface defined on the three-dimensional volume such that a luminous centroid-direction of an output beam is directed lateral to the axis of symmetry from the three-dimensional volume through the output surface.

38. The apparatus of claim 37, further comprising:
- an input surface comprising facets defined on the three-dimensional volume.

* * * * *

UNITED STATES PATENT AND TRADEMARK OFFICE
CERTIFICATE OF CORRECTION

PATENT NO. : 7,006,306 B2 Page 1 of 1
APPLICATION NO. : 10/903925
DATED : February 28, 2006
INVENTOR(S) : Falicoff, et al.

It is certified that error appears in the above-identified patent and that said Letters Patent is hereby corrected as shown below:

In the CLAIMS:

column 18, line 52, change "26" to --24--.

Signed and Sealed this

Twenty-ninth Day of August, 2006

JON W. DUDAS
*Director of the United States Patent and Trademark Office*